US012640345B2

(12) United States Patent
Hasegawa et al.

(10) Patent No.: US 12,640,345 B2
(45) Date of Patent: May 26, 2026

(54) HIGH-FREQUENCY POWER SUPPLY SYSTEM

(71) Applicant: DAIHEN Corporation, Osaka (JP)

(72) Inventors: Yuichi Hasegawa, Osaka (JP); Yuya Ueno, Osaka (JP)

(73) Assignee: DAIHEN Corporation, Osaka (JP)

( * ) Notice: Subject to any disclaimer, the term of this patent is extended or adjusted under 35 U.S.C. 154(b) by 280 days.

(21) Appl. No.: 18/396,695

(22) Filed: Dec. 27, 2023

(65) Prior Publication Data

US 2024/0222079 A1 Jul. 4, 2024

(30) Foreign Application Priority Data

Dec. 28, 2022 (JP) ................................. 2022-212634

(51) Int. Cl.
*H01J 37/32* (2006.01)

(52) U.S. Cl.
CPC .. *H01J 37/32165* (2013.01); *H01J 37/32128* (2013.01); *H01J 37/32146* (2013.01); *H01J 37/32183* (2013.01)

(58) Field of Classification Search
CPC .......... H01J 37/32155; H01J 37/32183; H01J 37/32146; H01J 37/32128; H01J 37/32165
See application file for complete search history.

(56) References Cited

U.S. PATENT DOCUMENTS 9,831,064 B2 * 11/2017 Konno .............. H01J 37/32146
9,947,514 B2    4/2018 Radomski et al.

10,304,669 B1    5/2019 Coumou et al.
2006/0151591 A1    7/2006 Matsuno
2007/0170997 A1    7/2007 Matsuno
2008/0129407 A1    6/2008 Matsuno
2013/0213573 A1    8/2013 Valcore, Jr. et al.
2013/0213934 A1    8/2013 Valcore, Jr. et al.
2013/0214682 A1    8/2013 Valcore, Jr. et al.
2013/0214683 A1    8/2013 Valcore, Jr. et al.
2013/0214828 A1    8/2013 Valcore, Jr. et al.
2014/0009073 A1    1/2014 Valcore, Jr. et al.
(Continued)

FOREIGN PATENT DOCUMENTS

JP    3183914 B2    7/2001
JP    4975291 B2    7/2012
(Continued)

*Primary Examiner* — Patrick C Chen
(74) *Attorney, Agent, or Firm* — Rimon P.C.

(57) ABSTRACT

A high-frequency power supply system according to the present disclosure includes a first power supply, a second power supply, a first matcher, and a second matcher. The second power supply performs pulse modulation of repeating an ON operation of outputting a second forward wave voltage and an OFF operation of not outputting the second forward wave voltage. The first power supply performs frequency modulation control in a second power supply ON period, and performs frequency offset control of outputting a forward wave voltage VF3 having a fundamental frequency obtained by adding an offset frequency to a fundamental frequency in a second power supply OFF period. The second matcher generates a phase reset signal having a frequency lower than a fundamental frequency based on detection information of a forward wave voltage, and supplies the phase reset signal to the first power supply.

2 Claims, 10 Drawing Sheets

(56) References Cited

U.S. PATENT DOCUMENTS

| | | | |
|---|---|---|---|
| 2014/0091875 A1 | 4/2014 | Shimomoto et al. | |
| 2014/0167613 A1 | 6/2014 | Fong et al. | |
| 2014/0172335 A1 | 6/2014 | Valcore, Jr. et al. | |
| 2014/0195033 A1 | 7/2014 | Lyndaker et al. | |
| 2014/0210508 A1 | 7/2014 | Valcore, Jr. et al. | |
| 2014/0214350 A1 | 7/2014 | Valcore, Jr. et al. | |
| 2014/0214351 A1 | 7/2014 | Valcore, Jr. et al. | |
| 2014/0214395 A1 | 7/2014 | Valcore, Jr. et al. | |
| 2014/0265852 A1 | 9/2014 | Valcore, Jr. et al. | |
| 2014/0305589 A1 | 10/2014 | Valcore, Jr. et al. | |
| 2014/0354173 A1 | 12/2014 | Matsuno | |
| 2015/0048740 A1 | 2/2015 | Valcore, Jr. et al. | |
| 2015/0069912 A1 | 3/2015 | Valcore, Jr. et al. | |
| 2015/0091440 A1 | 4/2015 | Osbourne | |
| 2015/0091441 A1 | 4/2015 | Marakhtanov et al. | |
| 2015/0122420 A1 | 5/2015 | Konno et al. | |
| 2015/0122421 A1* | 5/2015 | Konno | H01J 37/32183 |
| | | | 156/345.28 |
| 2015/0214012 A1 | 7/2015 | Valcore, Jr. et al. | |
| 2015/0244342 A1 | 8/2015 | Shimomoto et al. | |
| 2015/0311041 A1 | 10/2015 | Valcore, Jr. et al. | |
| 2016/0005573 A1 | 1/2016 | Valcore, Jr. et al. | |
| 2016/0044775 A1 | 2/2016 | Valcore, Jr. et al. | |
| 2016/0079037 A1* | 3/2016 | Hirano | H01J 37/32183 |
| | | | 156/345.28 |
| 2016/0172162 A1 | 6/2016 | Fong et al. | |
| 2016/0189937 A1 | 6/2016 | Valcore, Jr. et al. | |
| 2016/0233058 A1 | 8/2016 | Marakhtanov et al. | |
| 2016/0240356 A1 | 8/2016 | Howald et al. | |
| 2016/0259872 A1 | 9/2016 | Howald et al. | |
| 2016/0268100 A1 | 9/2016 | Valcore, Jr. et al. | |
| 2016/0276137 A1 | 9/2016 | Valcore, Jr. et al. | |
| 2016/0307736 A1 | 10/2016 | Howald et al. | |
| 2016/0307738 A1 | 10/2016 | Marakhtanov et al. | |
| 2016/0308560 A1 | 10/2016 | Howald et al. | |
| 2016/0322207 A1 | 11/2016 | Howald et al. | |
| 2016/0336152 A1 | 11/2016 | Valcore, Jr. et al. | |
| 2016/0343548 A1 | 11/2016 | Howald et al. | |
| 2017/0032945 A1 | 2/2017 | Valcore, Jr. et al. | |
| 2017/0062187 A1 | 3/2017 | Radomski et al. | |
| 2017/0084432 A1 | 3/2017 | Valcore, Jr. et al. | |
| 2017/0103872 A1 | 4/2017 | Howald et al. | |
| 2017/0178864 A1 | 6/2017 | Valcore, Jr. et al. | |
| 2017/0178873 A1 | 6/2017 | Valcore, Jr. et al. | |
| 2017/0194130 A1 | 7/2017 | Lyndaker et al. | |
| 2017/0294293 A1 | 10/2017 | Howald et al. | |
| 2017/0330732 A1 | 11/2017 | Valcore, Jr. et al. | |
| 2018/0018418 A1 | 1/2018 | Valcore, Jr. et al. | |
| 2018/0033596 A1 | 2/2018 | Valcore, Jr. et al. | |
| 2018/0053632 A1 | 2/2018 | Fong et al. | |
| 2018/0068834 A1 | 3/2018 | Valcore, Jr. et al. | |
| 2018/0294140 A1 | 10/2018 | Valcore, Jr. et al. | |
| 2018/0323038 A1 | 11/2018 | Valcore, Jr. et al. | |
| 2019/0057847 A1 | 2/2019 | Valcore, Jr. et al. | |
| 2019/0214232 A1 | 7/2019 | Morii et al. | |
| 2019/0272306 A1 | 9/2019 | Howald et al. | |
| 2019/0288683 A1 | 9/2019 | Morii et al. | |
| 2019/0318919 A1 | 10/2019 | Lyndaker et al. | |
| 2020/0067545 A1 | 2/2020 | Howald et al. | |
| 2020/0074034 A1 | 3/2020 | Valcore, Jr. et al. | |
| 2020/0211824 A1 | 7/2020 | Morii | |
| 2020/0212869 A1 | 7/2020 | Morii | |
| 2020/0212893 A1 | 7/2020 | Morii | |
| 2020/0218774 A1 | 7/2020 | Howald et al. | |
| 2020/0243304 A1 | 7/2020 | Valcore, Jr. et al. | |
| 2020/0412364 A1 | 12/2020 | Morii et al. | |
| 2021/0281235 A1 | 9/2021 | Morii | |
| 2022/0208519 A1* | 6/2022 | Hasegawa | H01J 37/32183 |
| 2022/0277934 A1 | 9/2022 | Valcore, Jr. et al. | |

FOREIGN PATENT DOCUMENTS

| | | |
|---|---|---|
| JP | 6084417 B2 | 2/2017 |
| JP | 6177012 B2 | 8/2017 |
| JP | 2017-188434 A | 10/2017 |
| JP | 6312405 B2 | 4/2018 |
| JP | 2018-536295 A | 12/2018 |
| JP | 6773283 B2 | 10/2020 |
| JP | 6898338 B2 | 7/2021 |
| JP | 2022-102688 A | 7/2022 |
| JP | 7105184 B2 | 7/2022 |
| JP | 7105185 B2 | 7/2022 |
| JP | 7112952 B2 | 8/2022 |

* cited by examiner

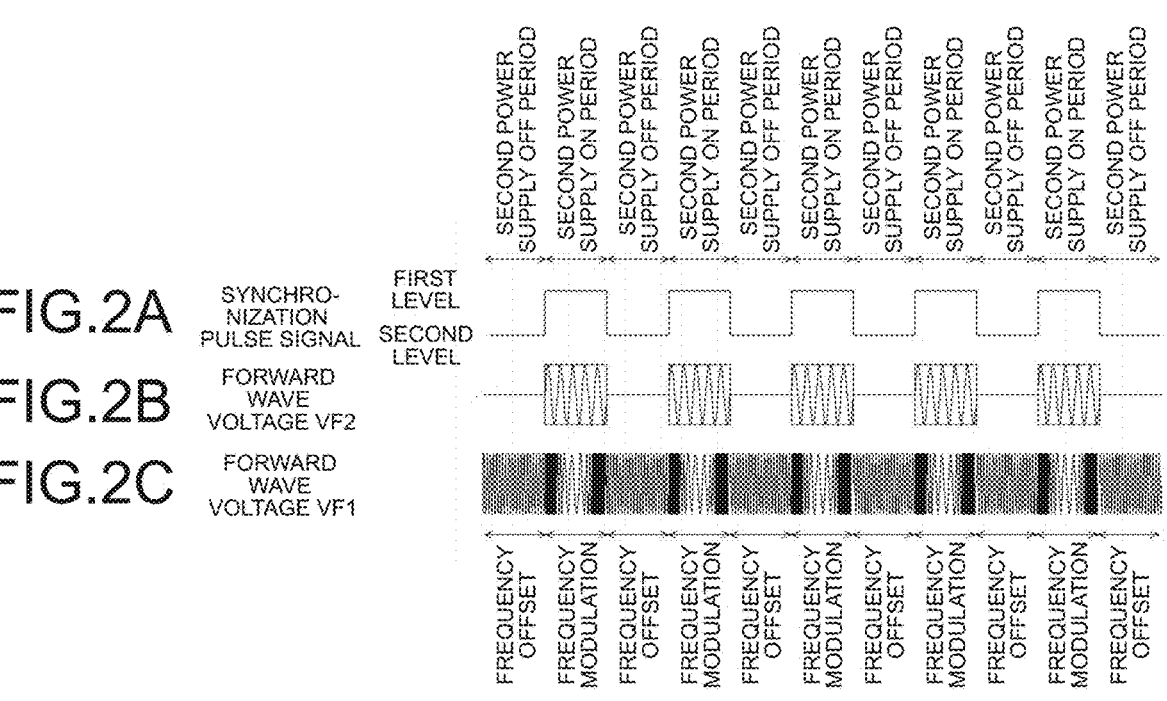
FIG.2A   SYNCHRO-NIZATION PULSE SIGNAL
FIG.2B   FORWARD WAVE VOLTAGE VF2
FIG.2C   FORWARD WAVE VOLTAGE VF1
FIG.3
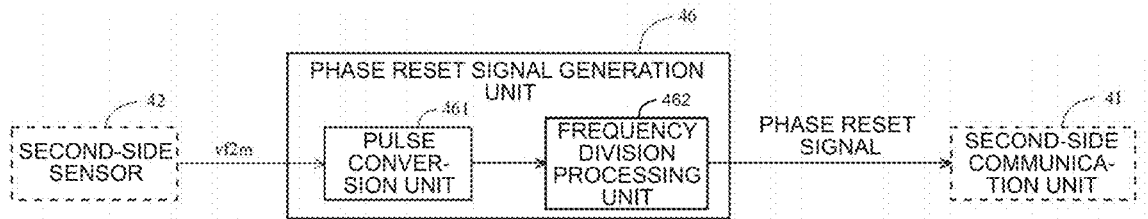

FIG.4A
FORWARD WAVE
VOLTAGE DETEC-
TION SIGNAL vf2m
FIG.4B
PULSE SIGNAL
FIG.4C
PHASE RESET
SIGNAL
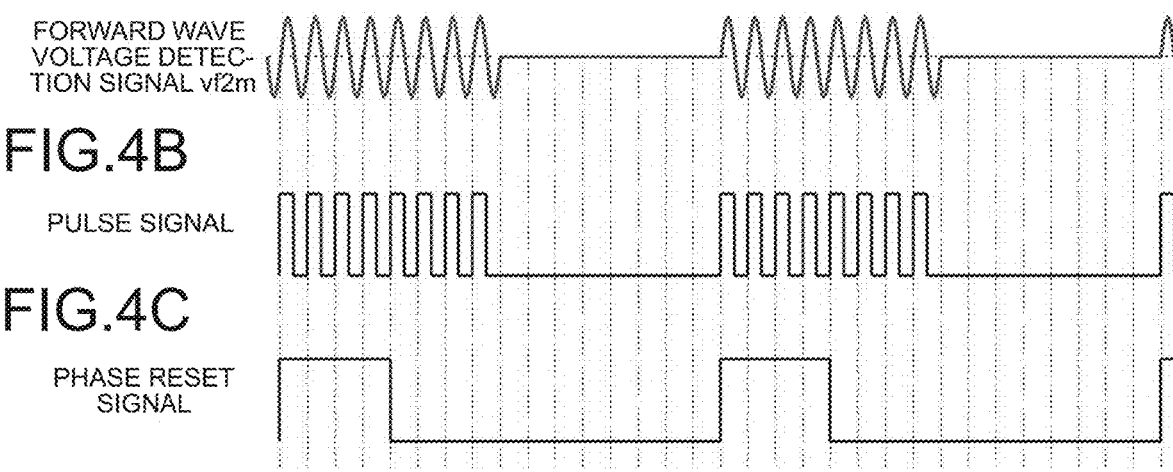
FIG.5
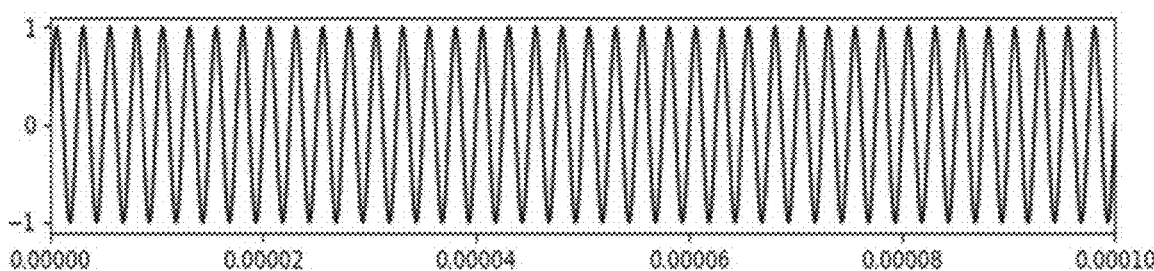
FIG.6
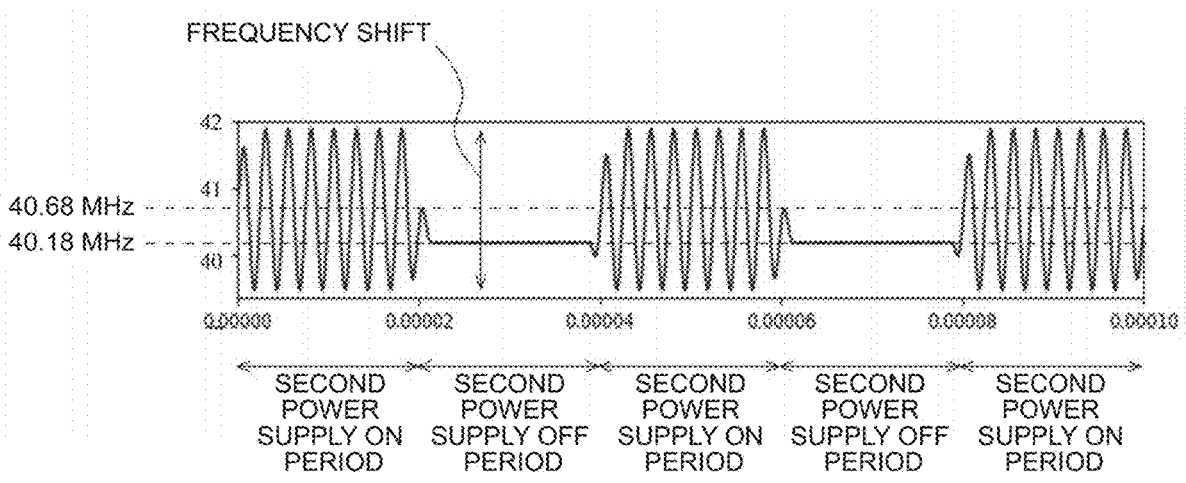

MODULATION SIGNAL

FORWARD WAVE
VOLTAGE VF1

FIG.8

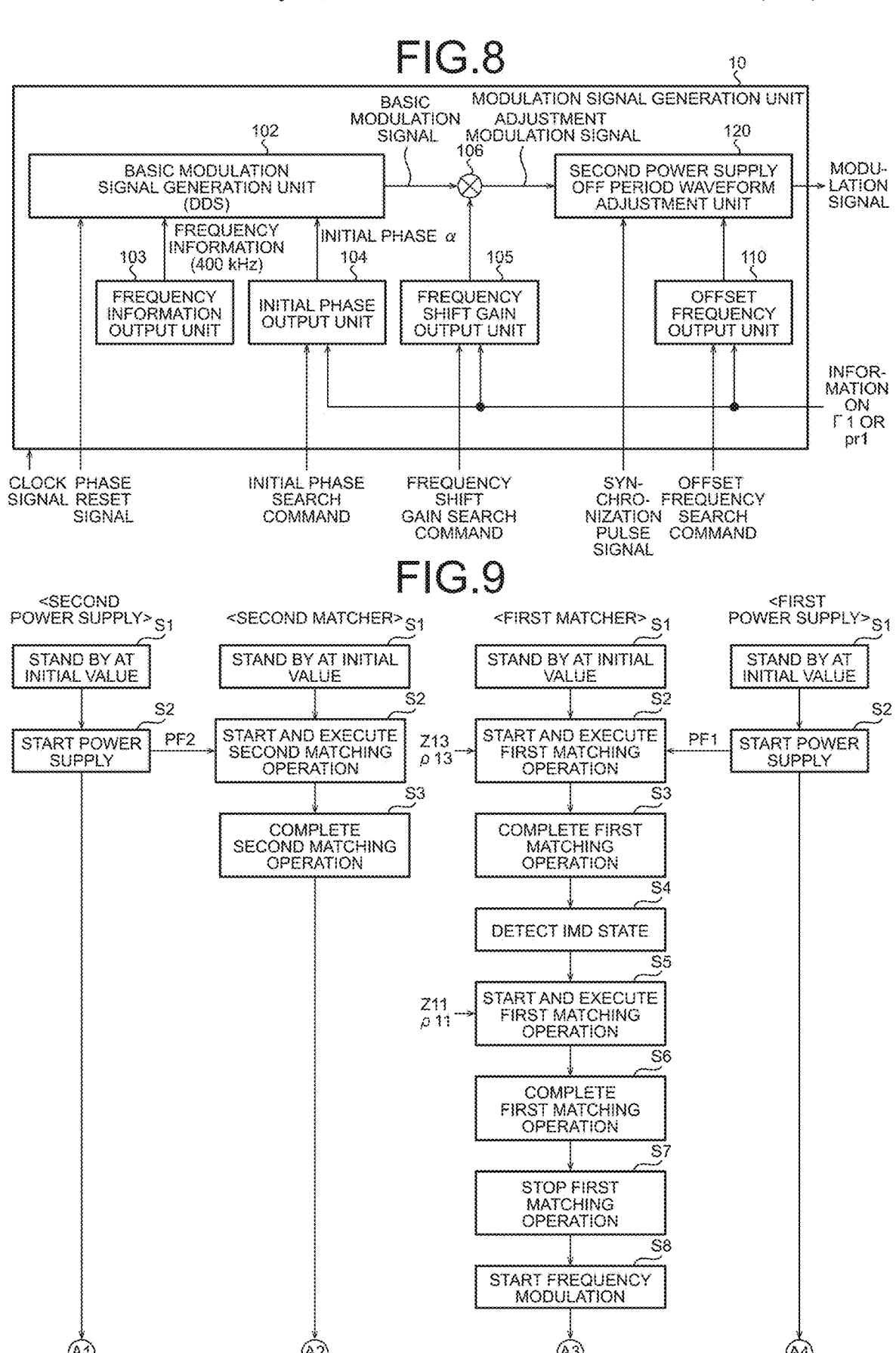

MODULATION SIGNAL GENERATION UNIT 10

BASIC MODULATION SIGNAL

ADJUSTMENT MODULATION SIGNAL

102

106

120

BASIC MODULATION SIGNAL GENERATION UNIT (DDS)

SECOND POWER SUPPLY OFF PERIOD WAVEFORM ADJUSTMENT UNIT

MODU-LATION SIGNAL

FREQUENCY INFORMATION (400 kHz)

INITIAL PHASE $\alpha$ 103            104            105            110

FREQUENCY INFORMATION OUTPUT UNIT

INITIAL PHASE OUTPUT UNIT

FREQUENCY SHIFT GAIN OUTPUT UNIT

OFFSET FREQUENCY OUTPUT UNIT

INFOR-MATION ON $\Gamma$ 1 OR pr1

CLOCK SIGNAL

PHASE RESET SIGNAL

INITIAL PHASE SEARCH COMMAND

FREQUENCY SHIFT GAIN SEARCH COMMAND

SYN-CHRO-NIZATION PULSE SIGNAL

OFFSET FREQUENCY SEARCH COMMAND

FIG.9

<SECOND POWER SUPPLY> S1

STAND BY AT INITIAL VALUE

S2

START POWER SUPPLY

PF2

<SECOND MATCHER> S1

STAND BY AT INITIAL VALUE

S2

START AND EXECUTE SECOND MATCHING OPERATION

Z13 $\rho$ 13

S3

COMPLETE SECOND MATCHING OPERATION

<FIRST MATCHER> S1

STAND BY AT INITIAL VALUE

S2

START AND EXECUTE FIRST MATCHING OPERATION

PF1

<FIRST POWER SUPPLY> S1

STAND BY AT INITIAL VALUE

S2

START POWER SUPPLY

S3

COMPLETE FIRST MATCHING OPERATION

S4

DETECT IMD STATE

S5

Z11 $\rho$ 11

START AND EXECUTE FIRST MATCHING OPERATION

S6

COMPLETE FIRST MATCHING OPERATION

S7

STOP FIRST MATCHING OPERATION

S8

START FREQUENCY MODULATION (A1)            (A2)            (A3)            (A4)

FIG.12

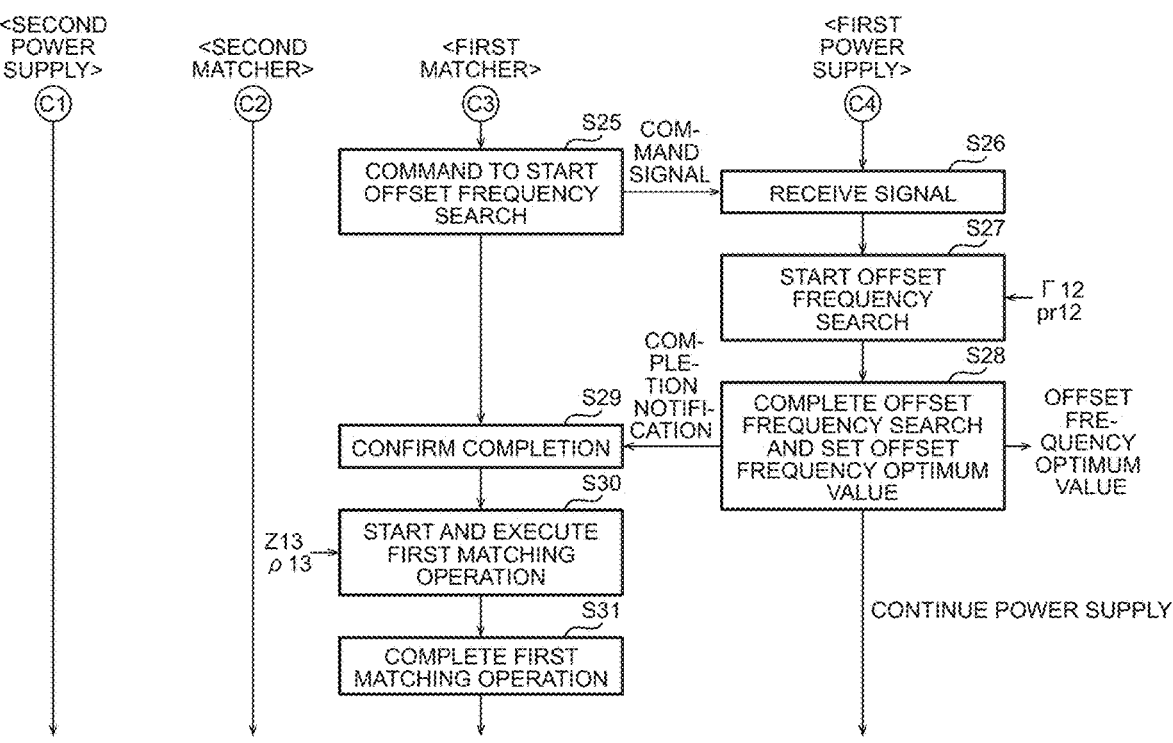

<SECOND POWER SUPPLY>
C1

<SECOND MATCHER>
C2

<FIRST MATCHER>
C3

<FIRST POWER SUPPLY>
C4

S25 COMMAND TO START OFFSET FREQUENCY SEARCH

COMMAND SIGNAL

S26 RECEIVE SIGNAL

S27 START OFFSET FREQUENCY SEARCH

Γ 12 pr12

S28 COMPLETE OFFSET FREQUENCY SEARCH AND SET OFFSET FREQUENCY OPTIMUM VALUE

COMPLETION NOTIFICATION

S29 CONFIRM COMPLETION

OFFSET FREQUENCY OPTIMUM VALUE

S30 START AND EXECUTE FIRST MATCHING OPERATION

Z13 ρ13

S31 COMPLETE FIRST MATCHING OPERATION

CONTINUE POWER SUPPLY

HIGH-FREQUENCY POWER SUPPLY SYSTEM

CROSS-REFERENCE TO RELATED APPLICATIONS

This application is based upon and claims the benefit of priority from Japanese Patent Application No. 2022-212634, filed on Dec. 28, 2022, the entire contents of which are incorporated herein by reference.

FIELD

The present disclosure relates to a high-frequency power supply system.

BACKGROUND

For example, a high-frequency power supply system used in a plasma processing apparatus includes two high-frequency power supplies (a first power supply and a second power supply), and outputs high-frequency voltages (forward wave voltages) having different fundamental frequencies (frequencies of fundamental waves) from the respective power supplies to a load. For example, the first power supply supplies high-frequency power (first forward wave power) to the load by outputting a high-frequency voltage (forward wave voltage VF1) having a fundamental frequency F1 suitable for generating plasma. The second power supply supplies high-frequency power (second forward wave power) to the load by outputting a high-frequency voltage (forward wave voltage VF2) having a fundamental frequency F2 (fundamental frequency F1>fundamental frequency F2) suitable for ion acceleration. (See JP 2018-536295 A, JP 2017-188434 A, and U.S. Pat. No. 10,304, 669.)

In addition, a first matcher is provided between the first power supply and the load, and impedance matching on the first power supply side is performed by adjusting a value of an internal variable element (for example, a capacitance value of a variable capacitor) such that a power value of reflected wave power at an output terminal of the first power supply (an input terminal of the first matcher) is reduced. In addition, a second matcher is provided between the second power supply and the load, and impedance matching on the second power supply side is performed by adjusting a value of an internal variable element (for example, a capacitance value of a variable capacitor) such that a power value of reflected wave power at an output terminal of the second power supply (an input terminal of the second matcher) is reduced.

SUMMARY

In the above configuration, intermodulation distortion (hereinafter IMD: InterModulation Distortion) occurs. As a result, a phenomenon occurs in which the reflected wave power fluctuates according to the cycle of the fundamental frequency F2 on the first power supply side. A technique is known in which the first power supply performs frequency modulation control in order to reduce the power value of the reflected wave power caused by the IMD.

However, this technique is a technique for reducing the power value of the reflected wave power when the IMD occurs. Therefore, when the second power supply performs pulse modulation of repeating an ON operation of outputting the forward wave voltage VF2 and an OFF operation of not outputting the forward wave voltage VF2 while the first power supply outputs the forward wave voltage VF1, the power value of the reflected wave power is difficult to be sufficiently reduced.

That is, since the IMD occurs in a second power supply ON period in which the second power supply performs the ON operation, the power value of the reflected wave power can be reduced by performing the frequency modulation control. However, in a second power supply OFF period in which the second power supply performs the OFF operation, the forward wave voltage VF2 is not output, so that the IMD does not occur. Therefore, when the output of the first power supply is frequency-modulated even in the second power supply OFF period, the power value of the reflected wave power is rather increased.

In addition, since the output state of the second power supply is greatly different between the second power supply ON period and the second power supply OFF period, the power value of the reflected wave power on the first power supply side cannot be reduced by a matching operation of the first matcher in both the second power supply ON period and the second power supply OFF period. This is because a time required for the matching operation of the first matcher is longer than a cycle time of the pulse modulation.

In addition, since the first power supply and the second power supply are different devices, the control cycle is determined based on different clock signals. In another clock signal, the cycle time of the clock signal is slightly different, and thus, there is a difference between a time recognized by the first power supply and a time recognized by the second power supply. Therefore, every time processing is executed, the difference between the time recognized by the first power supply and the time recognized by the second power supply accumulates and increases. This difference is preferably eliminated before it becomes too large.

The present invention has been made in view of the above, and an object of the present invention is to reduce a difference between a time recognized by a first power supply and a time recognized by a second power supply even when the second power supply performs pulse modulation of repeating an ON operation of outputting a forward wave voltage VF2 and an OFF operation of not outputting the forward wave voltage VF2 while the first power supply outputs a forward wave voltage VF1.

A high-frequency power supply system according to the present disclosure includes a second power supply, a first power supply, a first matcher, and a second matcher. The second power supply is capable of outputting a second forward wave voltage having a second fundamental frequency lower than a first fundamental frequency. The second power supply performs pulse modulation of repeating an ON operation of outputting the second forward wave voltage and an OFF operation of not outputting the second forward wave voltage. The first power supply is capable of outputting a first forward wave voltage having the first fundamental frequency. The first power supply performs frequency modulation control of frequency-modulating the first forward wave voltage with a modulation signal having a frequency substantially identical with the second fundamental frequency in a second power supply ON period in which the ON operation is performed. The first matcher is connected between the first power supply and a load. The second matcher is connected between the second power supply and the load. The second matcher generates a phase reset signal having a frequency lower than the second fundamental frequency, based on detection information of the second forward wave voltage, and supplies the phase reset signal to the first power supply. The first power supply sets an initial phase of the modulation signal at a timing of receiving the phase reset signal when performing the frequency modulation control of frequency-modulating the first forward wave voltage with the modulation signal having a frequency substantially identical with the second fundamental frequency.

BRIEF DESCRIPTION OF THE DRAWINGS

FIGS. 2A to 2C are diagrams illustrating a relationship between a forward wave voltage VF2 and a forward wave voltage VF1 with respect to a synchronization pulse signal;

FIG. 3 is a configuration example of a phase reset signal generation unit 46;

FIGS. 4A to 4C are diagrams for explaining a method of generating a phase reset signal;

FIG. 5 is an image diagram of a basic modulation signal that is a source of a modulation signal;

FIG. 6 is an image diagram of the modulation signal;

FIG. 8 is a diagram illustrating a configuration example of a modulation signal generation unit 10;

FIG. 9 is an example (part 1) of a flowchart when frequency modulation control and frequency offset control are performed;

FIG. 11 is an example (part 3) of a flowchart when the frequency modulation control and the frequency offset control are performed;

FIG. 12 is an example (part 4) of a flowchart when the frequency modulation control and the frequency offset control are performed;

FIGS. 13A and 13B illustrate examples (part 1) of a load-side impedance Z1 or a reflection coefficient ρ1;

DETAILED DESCRIPTION

Hereinafter, an embodiment of a high-frequency power supply system 90 according to the present disclosure will be described with reference to the drawings.

Figure 1:
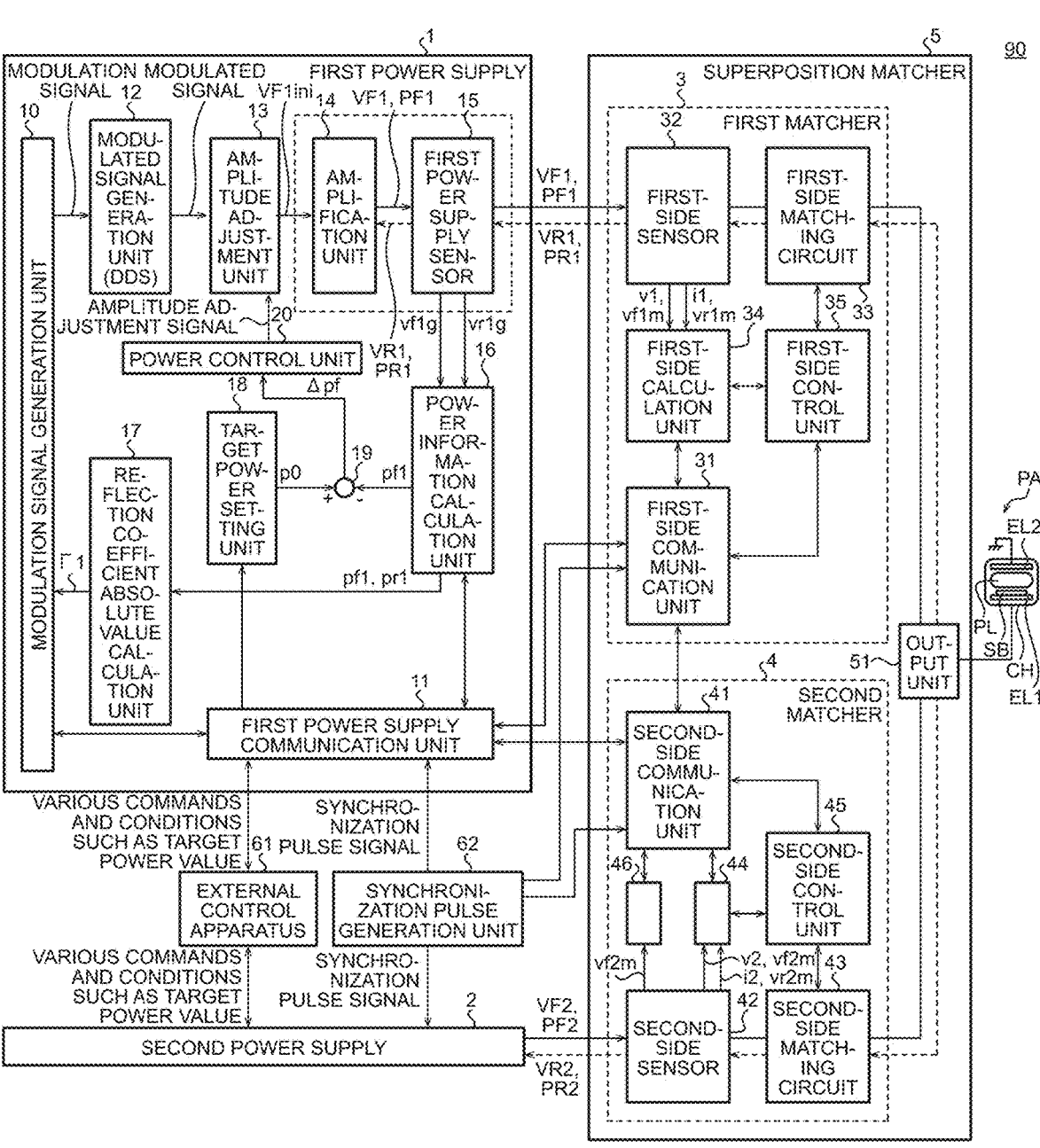
FIG. 1 is a diagram illustrating a configuration of a high-frequency power supply system 90.

FIG. 1 is a diagram illustrating a configuration of the high-frequency power supply system 90.

The high-frequency power supply system 90 is an apparatus that supplies high-frequency power to a load (for example, plasma processing apparatus PA) by outputting a high-frequency voltage having a frequency in an REF band (RF: Radio Frequency).

Such a high-frequency power supply system 90 includes, for example, a first power supply 1, a second power supply 2, and a superposition matcher 5. In addition, the superposition matcher 5 includes a first matcher 3, a second matcher 4, and an output unit 51. Then, high-frequency voltages having different fundamental frequencies (frequencies of fundamental waves) are output respectively from the first power supply 1 and the second power supply 2 to the load.

Note that in the present specification, the fundamental frequency of the first power supply 1 is defined as a fundamental frequency F1 (an example of a first fundamental frequency), the fundamental frequency of the second power supply 2 is defined as a fundamental frequency F2 (an example of a second fundamental frequency), and a frequency obtained by adding an offset frequency to the fundamental frequency F1 is defined as a fundamental frequency F3 (an example of a third fundamental frequency).

In addition, a high-frequency voltage output from the first power supply 1 to the load is defined as a forward wave voltage VF1 (an example of a first forward wave voltage), a high-frequency voltage reflected from the load side and returned to the first power supply 1 is defined as a reflected wave voltage VR1, high-frequency power output from the first power supply 1 to the load is defined as forward wave power PF1, and high-frequency power reflected from the load side and returned to the first power supply 1 is defined as reflected wave power PR1.

In addition, a high-frequency voltage output from the second power supply 2 to the load is defined as a forward wave voltage VF2 (an example of a second forward wave voltage), a high-frequency voltage reflected from the load side and returned to the second power supply 2 is defined as a reflected wave voltage VR2, high-frequency power output from the second power supply 2 to the load is defined as forward wave power PF2, and high-frequency power reflected from the load side and returned to the second power supply 2 is defined as reflected wave power PR2.

In addition, a power value of the forward wave power PF1 is defined as a forward wave power value pf1, a power value of the reflected wave power PR1 is defined as a reflected wave power value pr1, a power value obtained by subtracting the reflected wave power value pr1 from the forward wave power value pf1 is defined as a load-side power value pl1 (not illustrated), a power value of the forward wave power PF2 is defined as a forward wave power value pf2, a power value of the reflected wave power PR2 is defined as a reflected wave power value pr2, and a power value obtained by subtracting the reflected wave power value pr2 from the forward wave power value pf2 is defined as a load-side power value pl2 (not illustrated).

In addition, in the present specification, a reflection coefficient represented by a ratio of a reflected wave voltage to a forward wave voltage (reflected wave voltage/forward wave voltage) is ρ, and an absolute value (magnitude) of the reflection coefficient ρ is Γ.

In addition, subscripts are used as necessary to represent corresponding portions. For example, "1" is used for the system of the first power supply 1 and the first matcher 3, "2" is used for the system of the second power supply 2 and the second matcher 4, "g" is used for the first power supply 1, and "m" is used for the first matcher 3.

The first power supply 1 supplies the forward wave power PF1 to the load by outputting the forward wave voltage VF1 having the fundamental frequency F1. At this time, feedback control is performed such that the forward wave power value pf1 becomes a target power value p0. Note that it is also possible to perform feedback control such that the load-side power value pl1 becomes the target power value p0, but the description thereof will be omitted below.

The forward wave voltage VF1 has the fundamental frequency F1, which is relatively high and suitable for generating plasma. The fundamental frequency F1 is, for example, 40.68 MHz. Of course, the fundamental frequency F1 is not limited to 40.68 MHz, and may be a frequency in an industrial REF band such as 13.56 MHz or 27.12 MHz. In addition, as described later, the first power supply 1 is configured to perform frequency modulation control and frequency offset control.

The second power supply 2 supplies the second forward wave power to the load by outputting the forward wave voltage VF2 having the fundamental frequency F2 lower than the fundamental frequency F1. At this time, feedback control is performed such that the forward wave power value pf2 becomes a target power value. Note that feedback control may be performed such that the load-side power value pl2 becomes the target power value, but the description thereof will be omitted below.

The forward wave voltage VF2 has the fundamental frequency F2, which is relatively low and suitable for ion acceleration. The fundamental frequency F2 is, for example, 400 kHz. Of course, the fundamental frequency F2 is not limited to 400 kHz, and may be another frequency.

The second power supply 2 is configured to perform pulse modulation of repeating an ON operation of outputting the forward wave voltage VF2 and an OFF operation of not outputting the forward wave voltage VF2 at a predetermined cycle. Here, a period in which the second power supply 2 performs the ON operation is defined as a second power supply ON period, and a period in which the OFF operation is performed is defined as a second power supply OFF period.

In the second power supply ON period, the first power supply 1 outputs the forward wave voltage VF1, and the second power supply 2 outputs the forward wave voltage VF2, so that IMD occurs. However, in the second power supply OFF period, the first power supply 1 outputs the forward wave voltage VF1, but the second power supply 2 does not output the forward wave voltage VF2, so that the IMD does not occur.

Switching between the ON operation and the OFF operation in the second power supply 2 is performed based on, for example, a synchronization signal. The synchronization signal is for performing control corresponding to each of the second power supply ON period and the second power supply OFF period.

Note that the second power supply 2 may perform the pulse modulation of repeating the ON operation and the OFF operation without receiving the synchronization signal. In that case, the second power supply 2 may generate a synchronization signal corresponding to a synchronization pulse signal and output the synchronization signal to the first power supply 1 and the superposition matcher 5. In addition, the second matcher 4 of the superposition matcher 5 can generate the synchronization signal. In this case, the second matcher 4 may generate the synchronization signal corresponding to the synchronization pulse signal and output the synchronization signal to the first power supply 1.

For example, the superposition matcher 5 is electrically connected between the first power supply 1 and the second power supply 2 and a lower electrode EL1 of the plasma processing apparatus PA (an example of a load). In addition, the superposition matcher 5 includes the first matcher 3, the second matcher 4, and the output unit 51.

The plasma processing apparatus PA, which is an example of the load, is, for example, a parallel plate type, and has the lower electrode EL1 and an upper electrode EL2 facing each other in a chamber CH. A substrate SB to be processed can be placed on the lower electrode EL1. The first power supply 1 and the second power supply 2 are electrically connected to the lower electrode EL1 via the superposition matcher 5. The upper electrode EL2 is electrically connected to a ground potential. The chamber CH is connected to a gas supply apparatus (not illustrated) via an air supply pipe, and is connected to a vacuum apparatus (not illustrated) via an exhaust pipe.

An external control apparatus 61 is, for example, an apparatus that gives various commands (power supply ON or the like) and conditions such as a target power value to the high-frequency power supply system 90. In addition, it has a function of, for example, acquiring and monitoring data such as the forward wave power value pf1 calculated by the first power supply 1.

A synchronization pulse generation unit 62 generates a synchronization pulse signal as an example of a synchronization signal, and supplies the synchronization pulse signal to the first power supply 1, the second power supply 2, and the superposition matcher 5. As illustrated in FIGS. 2A to 2C described later, the synchronization pulse signal is a two-level rectangular wave-shaped pulse signal corresponding to a pulse modulation cycle of the second power supply 2. For example, the second power supply ON period may be set when the synchronization pulse signal is at a first level, and the second power supply OFF period may be set when the synchronization pulse signal is at a second level. Usually, the first level>the second level. For example, the first level is "1", and the second level is "0".

As an example of the synchronization signal, an example of using the synchronization pulse signal output by the synchronization pulse generation unit 62 is illustrated as described above, but another synchronization signal may be used. For example, a synchronization signal generated by the second power supply 2 or the second matcher 4 can be used. This is because since the pulse modulation cycle of the second power supply 2 is known, the second power supply 2 can generate the synchronization signal. In addition, this is because the second matcher 4 can acquire the pulse modulation cycle of the second power supply 2 based on information of the forward wave voltage VF2 detected by the second matcher 4.

In addition, the synchronization signal may not be a signal corresponding to each of the second power supply ON period and the second power supply OFF period. For example, it may be a pulse signal or the like corresponding to the start of the second power supply ON period. In this case, there is no signal corresponding to the second power supply OFF period, but since times of the second power supply ON period and the second power supply OFF period are known, the start timing of the second power supply OFF period can be recognized.

Description of Schematic Operation of
High-Frequency Power Supply System 90

The forward wave voltage VF1 output from the first power supply 1 is supplied to the lower electrode EL1 of the plasma processing apparatus PA via the first matcher 3 and the output unit 51. The forward wave voltage VF2 output from the second power supply 2 is supplied to the lower electrode EL1 of the plasma processing apparatus PA via the second matcher 4 and the output unit 51. That is, in the present embodiment, the forward wave voltage VF1 and the forward wave voltage VF2 are superimposed in the output unit 51 inside the superposition matcher 5, and supplied to the lower electrode EL1. As a result, the plasma processing apparatus PA generates plasma PL between the lower electrode EL1 and the upper electrode EL2. In addition, the superposition matcher 5 executes a first matching operation of matching an impedance on the first power supply 1 side to an impedance on the load side in the first matcher 3, and executes a second matching operation of matching an impedance on the second power supply 2 side to an impedance on the load side in the second matcher 4.

Note that the high-frequency power supply system 90 and the plasma processing apparatus PA are not limited to the configurations of FIG. 1. For example, there are various configurations such as a configuration in which the superposition matcher 5 does not include the output unit 51 that superimposes the forward wave voltage VF1 and the forward wave voltage VF2, the forward wave voltage VF1 output from the first power supply 1 is supplied to the upper electrode EL2 (in this case, unlike FIG. 1, it is not electrically connected to the ground potential) via the first matcher 3, and the forward wave voltage VF2 output from the second power supply 2 is supplied to the lower electrode EL1 via the second matcher 4. The high-frequency power supply system 90 of the present embodiment can also be used for such other configurations.

As mentioned above, when a plurality of the forward wave voltages having a difference in level between the fundamental frequencies are supplied from the first power supply 1 and the second power supply 2 to the load, a phenomenon may occur in which the reflected wave power value pr1 detected on a side of the first power supply 1 fluctuates according to a basic cycle (cycle of the fundamental wave) on a side of the second power supply 2 due to the influence of the IMD. The reflected wave power value pr1 at this time may be relatively large. Therefore, in order to reduce a reflection coefficient absolute value $\Gamma 1$ on the side of the first power supply 1, the first power supply 1 performs frequency modulation control and frequency offset control, and the first matcher 3 executes the matching operation of matching the impedance on the side of the first power supply 1 to the impedance on the load side.

FIGS. 2A to 2C are diagrams illustrating a relationship between the forward wave voltage VF2 and the forward wave voltage VF1 with respect to the synchronization pulse signal.

FIG. 2A is an example of the synchronization pulse signal, FIG. 2B is an example of the forward wave voltage VF2, and FIG. 2C is an example of the forward wave voltage VF1.

As illustrated in FIG. 2A, the synchronization pulse signal is a rectangular wave-shaped pulse signal that repeats the first level and the second level. As illustrated in FIG. 2B, since the second power supply 2 performs the ON operation when the synchronization pulse signal is at the first level, the second power supply 2 outputs the forward wave voltage VF2. In addition, since the second power supply 2 performs the OFF operation when the synchronization pulse signal is at the second level, the second power supply 2 does not output the forward wave voltage VF2.

As mentioned above, since the second power supply ON period is when the second power supply 2 performs the ON operation and the second power supply OFF period is when the second power supply 2 performs the OFF operation, the IMD may occur in the second power supply ON period, but the IMD does not occur in the second power supply OFF period. Therefore, since the first power supply 1 performs the frequency modulation control in the second power supply ON period and performs the frequency offset control in the second power supply OFF period, the fundamental frequency of the forward wave voltage VF1 of the first power supply 1 is different between the second power supply ON period and the second power supply OFF period as illustrated in FIG. 2C. However, as illustrated in FIG. 2C, the amplitude of the forward wave voltage VF1 of the first power supply 1 is the same between the second power supply ON period and the second power supply OFF period.

Note that FIG. 2C is an example of the forward wave voltage VF1 after a modulation parameter search step of the frequency modulation control and an offset frequency search step of the frequency offset control described later are completed. In addition, in FIG. 2C, the frequency at the first and last portions of the second power supply ON period is increased and the frequency at the central portion is reduced so that it can be seen that the frequency modulation is performed, but the present invention is not limited thereto.

Details of First Power Supply 1

The first power supply 1 performs frequency modulation control of frequency-modulating the forward wave voltage VF1 with a modulation signal having substantially the same frequency F2 as the second fundamental frequency in the second power supply ON period. In addition, the first power supply 1 performs frequency offset control of outputting the forward wave voltage VF3 having the fundamental frequency F3 obtained by adding an offset frequency to the fundamental frequency F1 in the second power supply OFF period.

Note that as one aspect of the frequency offset control, the offset frequency may be 0 Hz. That is, the frequency offset control may not be substantially performed. Even in this case, there is no adverse effect caused by performing the frequency modulation control in the second power supply OFF period, and thus an effect is provided. For example, if it is known that the offset frequency may be 0 Hz, it is not necessary to perform the offset frequency search step.

Hereinafter, the configuration of the first power supply 1 will be described with reference to FIG. 1.

The first power supply 1 includes a first power supply communication unit 11, a modulation signal generation unit 10, a modulated signal generation unit 12, an amplitude adjustment unit 13, an amplification unit 14, a first power supply sensor 15, a power information calculation unit 16, a reflection coefficient absolute value calculation unit 17, a target power setting unit 18, a subtraction unit 19, and a power control unit 20.

Note that in the first power supply 1, a portion that performs calculation processing or signal processing can be configured by, for example, a central processing unit (CPU), a field programmable gate array (FPGA), a storage medium such as a memory, or the like. In addition, the operation of each unit can be controlled according to a control program stored in advance in a read only memory (ROM) or the like, and processing such as input/output, calculation, and time measurement can be performed. In addition, the first power supply 1 includes a basic clock generation unit (not illustrated), and processing is executed for each control cycle based on a clock signal output from the basic clock generation unit.

The first power supply communication unit 11 receives the synchronization pulse signal output by the synchronization pulse generation unit 62 as a synchronization signal, and outputs the synchronization pulse signal to the modulation signal generation unit 10, the power information calculation unit 16, and the target power setting unit 18. In addition, communication can be performed with the first matcher 3 and the second matcher 4. For example, an initial phase search command can be received from the first matcher 3.

In addition, the first power supply communication unit 11 can also communicate with the external control apparatus 61. For example, information such as the target power value p0 can be received from the external control apparatus 61, and the information can be output to the target power setting unit 18. In addition, for example, the forward wave power value pf1 and the reflected wave power value pr1 calculated by the power information calculation unit 16 can be output to the external control apparatus 61. In the external control apparatus 61, it is possible to utilize, for example, monitor the received information. In addition, transmission and reception can be performed with the first matcher 3 and the second matcher 4, but the description thereof will be omitted.

The modulation signal generation unit 10 generates a modulation signal having substantially the same frequency as the fundamental frequency F2, and outputs the modulation signal to the modulated signal generation unit 12. The modulation signal is a signal for determining the frequency of the forward wave voltage VF1 output from the first power supply 1, and has waveform information corresponding to each of the ON operation and the OFF operation in the second power supply 2. This modulation signal will be described later. Note that the modulation signal generation unit 10 can recognize the second power supply ON period and the second power supply OFF period based on the synchronization signal output from the first power supply communication unit 11.

The modulated signal generation unit 12 outputs a modulated signal in which an initial phase α, a frequency shift, and an offset frequency are adjusted based on frequency information indicated by the modulation signal. For example, a direct digital synthesizer (DDS) can be used for the modulated signal generation unit 12.

The modulated signal has a waveform similar to that in FIG. 2C, and has a waveform in which a frequency modulation period and a constant frequency period are repeated. That is, the modulated signal has a constant amplitude, but is frequency-modulated by the modulation signal in the second power supply ON period, and is a waveform signal whose frequency is offset by the modulation signal in the second power supply OFF period. Note that the modulated signal has the waveform similar to that of the forward wave voltage VF1 in FIG. 2C and thus is represented like an analog waveform signal, but is actually digital data, and data is generated and output for each control cycle.

The amplitude adjustment unit 13 receives the modulated signal output from the modulated signal generation unit 12 and an amplitude adjustment signal output from the power control unit 20. Then, the amplitude of the modulated signal is adjusted based on the amplitude adjustment signal, and the modulated signal is output to the amplification unit 14 as a forward wave voltage initial signal VF1*ini*. As a result, the amplitude of the forward wave voltage VF1 is changed such that the forward wave power value pf1, which is the power value of a first forward wave power PF output from the first power supply 1 (amplification unit 14), becomes the target power value p0 set by the target power setting unit 18 described later.

Note that the forward wave voltage initial signal VF1*ini* output from the amplitude adjustment unit 13 is actually digital data, and data is generated and output for each control cycle.

In addition, a D/A converter (not illustrated) is provided between the amplitude adjustment unit 13 and the amplification unit 14.

The amplification unit 14 amplifies the forward wave voltage initial signal VF1*ini* output from the amplitude adjustment unit 13, and outputs the amplified signal as the forward wave voltage VF1. The waveform of the forward wave voltage VF1 has a waveform similar to that of the modulated signal output from the modulated signal generation unit 12. Of course, the amplitudes of the modulated signal and the forward wave voltage VF1 are different, but the frequencies thereof are substantially the same.

That is, it can be said that the first power supply 1 performs frequency modulation control of modulating the forward wave voltage VF1 with a modulation signal having substantially the same frequency (e.g., 400 kHz in the present embodiment) as the fundamental frequency F2 in the second power supply ON period, and performs frequency offset control of outputting the forward wave voltage VF3 having the fundamental frequency F3 obtained by adding an offset frequency to the fundamental frequency F1 in the second power supply OFF period. In addition, a filter for removing harmonic components and the like may be provided at a preceding stage of the amplification unit 14. In addition, a filter for removing harmonic components and the like may be provided at a subsequent stage of the amplification unit 14.

The first power supply sensor 15 is provided at an output terminal of the first power supply 1, passes the forward wave voltage VF1 output from the amplification unit 14, and outputs the forward wave voltage VF1 to the first matcher 3 of the superposition matcher 5. In addition, the forward wave voltage VF1 output from the amplification unit 14 is detected, and a forward wave voltage detection signal vf1*g*, which is the detection signal, is output to the power information calculation unit 16. In addition, the reflected wave voltage VR1 reflected from the load side and returned to the first power supply 1 is detected, and a reflected wave voltage detection signal vr1*g*, which is the detection signal, is output to the power information calculation unit 16.

Note that an A/D converter (not illustrated) is provided between the first power supply sensor 15 and the power information calculation unit 16.

The power information calculation unit 16 receives the forward wave voltage detection signal vf1*g* and the reflected wave voltage detection signal vr1*g* output from the first power supply sensor 15, and calculates the forward wave power value pf1 and the reflected wave power value pr1 based on the received signals.

(1) Forward Wave Power Value pf1

The power information calculation unit 16 calculates the forward wave power value pf1 based on the received forward wave voltage detection signal vf1*g*. For example, the received forward wave voltage detection signal vf1*g* is squared, information of an unnecessary frequency component is then cut by a low-pass filter (for example, an IIR filter or the like) that extracts a desired component, and a constant for conversion into the forward wave power value pf1 is further multiplied to calculate the forward wave power value pf1. The forward wave power value pf1 can be calculated by, for example, the forward wave voltage detection signal vf1*g*^2/R (R: a gain corresponding to a resistance value). The calculated forward wave power value pf1 is output to the reflection coefficient absolute value calculation unit 17 and the subtraction unit 19.

Of course, the calculation method is not limited to the above. For example, a moving average value in a predetermined period may be used. In addition, an average value in a predetermined period may be used. In short, information on the forward wave power value pf1 may be calculated. In the following description, the forward wave power value pf1 is simply referred to, but it also includes a case where processing such as calculation of a moving average value or an average value is performed.

In addition, the forward wave power value pf1 calculated based on the forward wave voltage detection signal vf1g detected in the second power supply ON period is defined as a forward wave power value pf11, the forward wave power value pf1 calculated based on the forward wave voltage detection signal vf1g detected in the second power supply OFF period is defined as a forward wave power value pf12, and the forward wave power value pf1 calculated based on the forward wave voltage detection signal vf1g detected in both the second power supply ON period and the second power supply OFF period is defined as a forward wave power value pf13.

In addition, although the forward wave power value pf1 is output to the reflection coefficient absolute value calculation unit 17 and the subtraction unit 19 described later, they may be different. For example, the condition of the low-pass filter may be different.

(2) Reflected Wave Power Value pr1

The power information calculation unit 16 calculates the reflected wave power value pr1 based on the received reflected wave voltage detection signal vr1g. For example, the received reflected wave voltage detection signal vr1g is squared, information of an unnecessary frequency component is then cut by a low-pass filter (for example, an IIR filter or the like) that extracts a desired component, and a constant for conversion into the reflected wave power value pr1 is further multiplied to calculate the reflected wave power value pr1. The reflected wave power value pr1 can be calculated by, for example, the reflected wave voltage detection signal $vr1g^2/R$ (R: a gain corresponding to a resistance value). The calculated reflected wave power value pr1 is output to the reflection coefficient absolute value calculation unit 17.

Of course, the calculation method is not limited to the above. For example, a moving average value in a predetermined period may be used. In addition, an average value in a predetermined period may be used. In short, information on the reflected wave power value pr1 may be calculated. In the following description, the reflected wave power value pr1 is simply referred to, but it also includes a case where processing such as calculation of a moving average value or an average value is performed.

In addition, the reflected wave power value pr1 calculated based on the reflected wave voltage detection signal vr1g detected in the second power supply ON period is defined as a reflected wave power value pr11, the reflected wave power value pr1 calculated based on the reflected wave voltage detection signal vr1g detected in the second power supply OFF period is defined as a reflected wave power value pr12, and the reflected wave power value pr1 calculated based on the reflected wave voltage detection signal vr1g detected in both the second power supply ON period and the second power supply OFF period is defined as a reflected wave power value pr13.

The reflection coefficient absolute value calculation unit 17 calculates the reflection coefficient absolute value Γ1 based on the forward wave power value pf1 and the reflected wave power value pr1. The reflection coefficient absolute value Γ1 can be calculated by, for example, √ (reflected wave power value pr1/forward wave power value pf1). The calculated reflection coefficient absolute value Γ1 is output to the modulation signal generation unit 10.

Of course, the calculation method is not limited to the above. For example, a moving average value in a predetermined period may be used. In addition, an average value in a predetermined period may be used. In short, information on the reflection coefficient absolute value Γ1 may be calculated. In the following description, the reflection coefficient absolute value Γ1 is simply referred to, but it also includes a case where processing such as calculation of a moving average value or an average value is performed.

In addition, the reflection coefficient absolute value Γ1 calculated based on the forward wave power value pf1 and the reflected wave power value pr1 detected in the second power supply ON period is defined as a reflection coefficient absolute value Γ11, the reflection coefficient absolute value Γ1 calculated based on the forward wave power value pf1 and the reflected wave power value pr1 detected in the second power supply OFF period is defined as a reflection coefficient absolute value Γ12, and the reflection coefficient absolute value Γ1 calculated based on the forward wave power value pf1 and the reflected wave power value pr1 detected in both the second power supply ON period and the second power supply OFF period is defined as a reflection coefficient absolute value Γ13.

In the target power setting unit 18, the target power value p0 is set in advance as a target value of the forward wave power value pf1. The target power setting unit 18 outputs the target power value p0 to the subtraction unit 19.

The subtraction unit 19 subtracts the forward wave power value pf1 from the target power value p0 and outputs a subtraction result as error information Δpf to the power control unit 20.

The power control unit 20 generates an amplitude adjustment signal for controlling the amplitude of the forward wave voltage initial signal VF1*ini* according to the error information Δpf, and outputs the amplitude adjustment signal to the amplitude adjustment unit 13. As a result, the amplitude of the forward wave voltage initial signal VF1*ini* can be determined. That is, the amplitude of the forward wave voltage VF1 can be adjusted by adjusting the magnitude of the amplitude adjustment signal, and eventually, the forward wave power value pf1 can be adjusted.

For example, when the target power value p0 is 1,000 (W) and the forward wave power value pf1 is 950 (W), 50 (W) is insufficient with respect to the target power value p0, and thus the power control unit 20 determines the magnitude of the amplitude adjustment signal so as to increase the forward wave power value pf1 to be supplied to the load by 50 (W) and outputs the amplitude adjustment signal. For example, a known method such as PI control or PID control can be used to control the amplitude of the forward wave voltage initial signal VF1*ini*.

Details of Superposition Matcher 5

The superposition matcher 5 includes the first matcher 3, the second matcher 4, and the output unit 51. For example, the first matcher 3 is electrically connected between the first power supply 1 and the lower electrode EL1. For example, the second matcher 4 is electrically connected between the second power supply 2 and the lower electrode EL1. The first matcher 3 executes the first matching operation, and the second matcher 4 executes the second matching operation.

First Matcher 3

The first matcher 3 includes a first-side communication unit 31, a first-side sensor 32, a first-side matching circuit 33, a first-side calculation unit 34, and a first-side control unit 35.

Note that in the first matcher 3, a portion that performs calculation processing or signal processing can be configured by, for example, a central processing unit (CPU), a field programmable gate array (FPGA), a storage medium such as a memory, or the like. In addition, the operation of each unit can be controlled according to a control program stored in advance in a read only memory (ROM) or the like, and processing such as input/output, calculation, and time measurement can be performed. In addition, the first matcher 3 includes a basic clock generation unit (not illustrated), and processing is executed for each control cycle based on a clock signal output from the basic clock generation unit.

The first-side communication unit 31 receives the synchronization pulse signal output by the synchronization pulse generation unit 62 as a synchronization signal, and outputs the synchronization pulse signal to the first-side calculation unit 34 and the first-side control unit 35. In addition, the first-side communication unit 31 can communicate with the first power supply 1 and the second matcher 4. For example, the reflection coefficient ρ1 calculated by the first matcher 3 can be output to the first power supply 1.

The first-side sensor 32 is provided at an input terminal of the first matcher 3, and detects information for calculating the load-side impedance Z1 when the load side is viewed from the input terminal of the first matcher 3 (equivalent to the output terminal of the first power supply 1) or information for calculating the reflection coefficient ρ1 at the input terminal of the first matcher 3. Since the load-side impedance Z1 and the reflection coefficient ρ1 can be mutually converted, either of them may be detected.

When the load-side impedance Z1 is calculated, for example, a voltage detector and a current detector are used as the first-side sensor 32. In this case, a voltage at the input terminal of the first matcher 3 is detected by the voltage detector, and a voltage detection signal v1 is output as the detection signal. In addition, a current at the input terminal of the first matcher 3 is detected by the current detector, and a current detection signal i1 is output as the detection signal. The voltage detection signal v1 and the current detection signal i1 are output to the first-side calculation unit 34.

When the reflection coefficient ρ1 at the input terminal of the first matcher 3 is calculated, for example, a directional coupler is used as the first-side sensor 32. In this case, the forward wave voltage VF1 output from the first power supply 1 is detected, a forward wave voltage detection signal vf1*m* is output as the detection signal, the reflected wave voltage VR1 reflected and returned from the load side is detected, and a reflected wave voltage detection signal vr1*m* is output as the detection signal. The forward wave voltage detection signal vf1*m* and the reflected wave voltage detection signal vr1*m* are output to the first-side calculation unit 34.

Note that an A/D converter (not illustrated) is provided between the first-side sensor 32 and the first-side calculation unit 34.

The first-side matching circuit 33 is provided between the first-side sensor 32 and the output unit 51. The first-side matching circuit 33 includes, for example, a variable element such as a variable capacitor (also referred to as a variable capacitor) that can change a capacitance (capacitance) inside the first-side matching circuit 33, and can adjust the load-side impedance Z1 when the load side is viewed from the input terminal of the first matcher 3 by changing a variable value (capacitance in the case of a variable capacitor and inductance in the case of a variable inductor) of the variable element in accordance with a command from the first-side control unit 35 described later. A variable inductor may be provided as the variable element. In addition, a drive circuit (not illustrated) is provided to change the capacitance of the variable element in accordance with the command from the first-side control unit 35.

In addition to the variable element, an inductor having a fixed inductance value is often provided. In addition, a capacitor having a fixed capacitance (capacitance) value may be provided.

As such a first-side matching circuit 33, a matching circuit of a so-called inverted L type (also referred to as an L type), a π type, or the like is often used.

Note that there are various types of variable capacitors. For example, there is a variable capacitor of a type in which a capacitance is changed by changing a distance between electrodes. In addition, there is a variable capacitor of a type in which a plurality of capacitors connected in series to a switch are connected in parallel, and the overall capacitance is changed by changing the state (ON/OFF) of the switch. Thus, the type of the variable capacitor is not limited.

The first-side calculation unit 34 calculates the reflection coefficient ρ1 or the load-side impedance Z1 based on the information output from the first-side sensor 32, and outputs the reflection coefficient ρ1 or the load-side impedance Z1 to the first-side control unit 35 as first-side load information. The reflection coefficient ρ1 and the load-side impedance Z1 are information indicating the state of the load. Note that the first-side calculation unit 34 may include a filter for removing unnecessary signal components (for example, harmonic components) on the input side. At this time, a filter method may be appropriately selected.

The reflection coefficient ρ1 can be calculated by, for example, the reflected wave voltage detection signal vr1*m*/ the forward wave voltage detection signal vf1*m*. In addition, the load-side impedance Z1 can be calculated by, for example, the voltage detection signal v1/the current detection signal i1. In addition, the load-side impedance Z1 can be calculated based on, for example, the magnitude of the voltage detection signal v1, the magnitude of the current detection signal i1, and a phase difference θ between the voltage detection signal v1 and the current detection signal i1. Since a method of calculating the reflection coefficient ρ1 and the load-side impedance Z1 is well known, the description thereof will be omitted.

In addition, since the reflection coefficient ρ1 and the load-side impedance Z1 can be mutually converted, the explanation may be made such that the first-side calculation unit 34 calculates only either the reflection coefficient ρ1 or the load-side impedance Z1 in the following in order to simplify the description.

In addition, the reflection coefficient ρ1 calculated based on the information detected by the first-side sensor 32 in the second power supply ON period is defined as a reflection coefficient ρ11, and the load-side impedance Z1 calculated based on the information detected by the first-side sensor 32 in the second power supply ON period is defined as a load-side impedance Z1.

In addition, the reflection coefficient ρ1 calculated based on the information detected by the first-side sensor 32 in the second power supply OFF period is defined as a reflection coefficient $\rho 12$, and the load-side impedance Z1 calculated based on the information detected by the first-side sensor 32 in the second power supply ON period is defined as a load-side impedance Z12.

In addition, the reflection coefficient $\rho 1$ calculated based on the information detected by the first-side sensor 32 in both the second power supply ON period and the second power supply OFF period is defined as a reflection coefficient $\rho 13$, and the load-side impedance Z1 calculated based on the information detected by the first-side sensor 32 in the second power supply ON period is defined as a load-side impedance Z13.

Using the first-side load information output from the first-side calculation unit 34, the first-side control unit 35 outputs a command signal for controlling the variable value of the variable element inside the first-side matching circuit 33 such that the absolute value $\Gamma 1$ of the reflection coefficient $\rho 1$ approaches the target reflection coefficient absolute value $\Gamma 0$ (usually 0). In other words, a command signal for controlling the variable value of the variable element inside the first-side matching circuit 33 is output such that the load-side impedance Z1 becomes a complex conjugate of an output impedance Z0 of the first power supply 1. For example, when the variable element included in the first-side matching circuit 33 is a variable capacitor, a command signal for controlling a capacitance is output. More specifically, for example, a capacitance of the variable capacitor at which the absolute value $\Gamma 1$ of the reflection coefficient $\rho 1$ is predicted to be closest to the target reflection coefficient absolute value $\Gamma 0$ is calculated, and the command signal is output to the drive circuit that drives the variable capacitor so as to have the capacitance.

The first-side control unit 35 repeatedly performs such control. As a result, when the absolute value $\Gamma 1$ of the reflection coefficient $\rho 1$ becomes equal to or less than a predetermined threshold, it is regarded that the first matching operation is completed, and a completion notification indicating that the first matching operation is completed can be output to the first power supply 1 via the first-side communication unit 31. For such matching operation, there are many methods disclosed in, for example, JP 3183914 B2, JP 4975291 B2, JP 6084417 B2, JP 6177012 B2, JP 6312405 B2, JP 7105185 B2, JP 7105184 B2, JP 7112952 B2, JP 6898338 B2, and JP 6773283 B2, and thus a suitable control method may be selected.

The second matcher 4 includes a second-side communication unit 41, a second-side sensor 42, a second-side matching circuit 43, a second-side calculation unit 44, a second-side control unit 45, and a phase reset signal generation unit 46. Except for the phase reset signal generation unit 46, they have functions similar to those of the first-side communication unit 31, the first-side sensor 32, the first-side matching circuit 33, the first-side calculation unit 34, and the first-side control unit 35 of the first matcher 3 although the applied frequencies and the like are different, and thus the description thereof will be omitted.

Note that similarly to the first-side calculation unit 34, the second-side calculation unit 44 calculates the reflection coefficient $\rho 2$ or the load-side impedance Z2 based on the information (reflected wave voltage detection signal vr$2m$ and forward wave voltage detection signal vf$2m$, or voltage detection signal v2 and current detection signal i2) output from the second-side sensor 42, and outputs the reflection coefficient $\rho 2$ or the load-side impedance Z2 to the second-side control unit 45 as second-side load information.

FIG. 3 is a configuration example of the phase reset signal generation unit 46.

FIGS. 4A to 4C are diagrams for explaining a method of generating a phase reset signal.

The phase reset signal generation unit 46 includes a pulse conversion unit 461 and a frequency division processing unit 462.

The pulse conversion unit 461 includes a comparator, and converts the forward wave voltage detection signal vf$2m$ having a sinusoidal shape in the second power supply ON period into a rectangular signal using the comparator. For example, as illustrated in FIG. 4A, when the amplitude of the forward wave voltage detection signal vf$2m$ exceeds the center of the amplitude, the signal is set to High level, and when the amplitude falls below the center of the amplitude, the signal is set to Low level, so that the pulse signal corresponding to the forward wave voltage detection signal vf$2m$ can be generated as illustrated in FIG. 4B.

Note that in the forward wave voltage detection signal vf$2m$, for example, each of a period between timings t0 and t1, a period between timings t1 and t2, . . . , and a period between timings t7 and t8 is one cycle corresponding to the basic cycle of the second power supply 2. In addition, a period between the timings t0 and t8 and a period between timings t16 and t24 are the second power supply ON period, so that the forward wave voltage detection signal vf$2m$ can be detected. However, a period between the timings t8 and t16 and a period between the timing t24 and a timing t32 are the second power supply OFF period, so that the forward wave voltage detection signal vf$2m$ is difficult to be detected.

The frequency division processing unit 462 divides the pulse signal having the fundamental frequency F2 by N (N is an integer of 2 or more), and generates a phase reset signal having a pulse frequency of F2/N. The phase reset signal generation unit 46 outputs the generated phase reset signal to the first power supply 1 via the second-side communication unit 41.

In the present embodiment, the fundamental frequency F2 is 400 kHz, so that when N=8, the pulse frequency F2/N=400 kHz/8=50 kHz as illustrated in FIG. 4C.

Since the phase reset signal is a signal generated based on the actual forward wave voltage VF2, the phase reset signal becomes a signal synchronized with the forward wave voltage VF2.

Modulation Signal

FIG. 5 is an image diagram of a basic modulation signal that is a source of a modulation signal.

In FIG. 5, the horizontal axis represents time, and the vertical axis represents frequency. As illustrated in FIG. 5, the modulation signal generation unit 10 first generates a sinusoidal signal having the same frequency as the fundamental frequency F2 as a basic modulation signal. At this time, the waveform is shifted in the time axis direction by the initial phase $\alpha$ in consideration of the initial phase $\alpha$ as described later. Note that the amplitude indicating the frequency shift is, for example, $\pm 1$. This is because the amplitude is set and the waveform is adjusted in a subsequent step. Such a basic modulation signal can be generated by, for example, a direct digital synthesizer (DDS).

FIG. 6 is an image diagram of the modulation signal.

In FIG. 6, the horizontal axis represents time, the vertical axis represents frequency, and changes in the fundamental frequency of the first power supply 1 in the second power supply ON period and the second power supply OFF period are illustrated. Note that in FIG. 6, the modulation signal is represented like an analog waveform signal, but is actually digital data, and data indicating frequency information is generated and output for each control cycle.

Figures 7A, 7B:
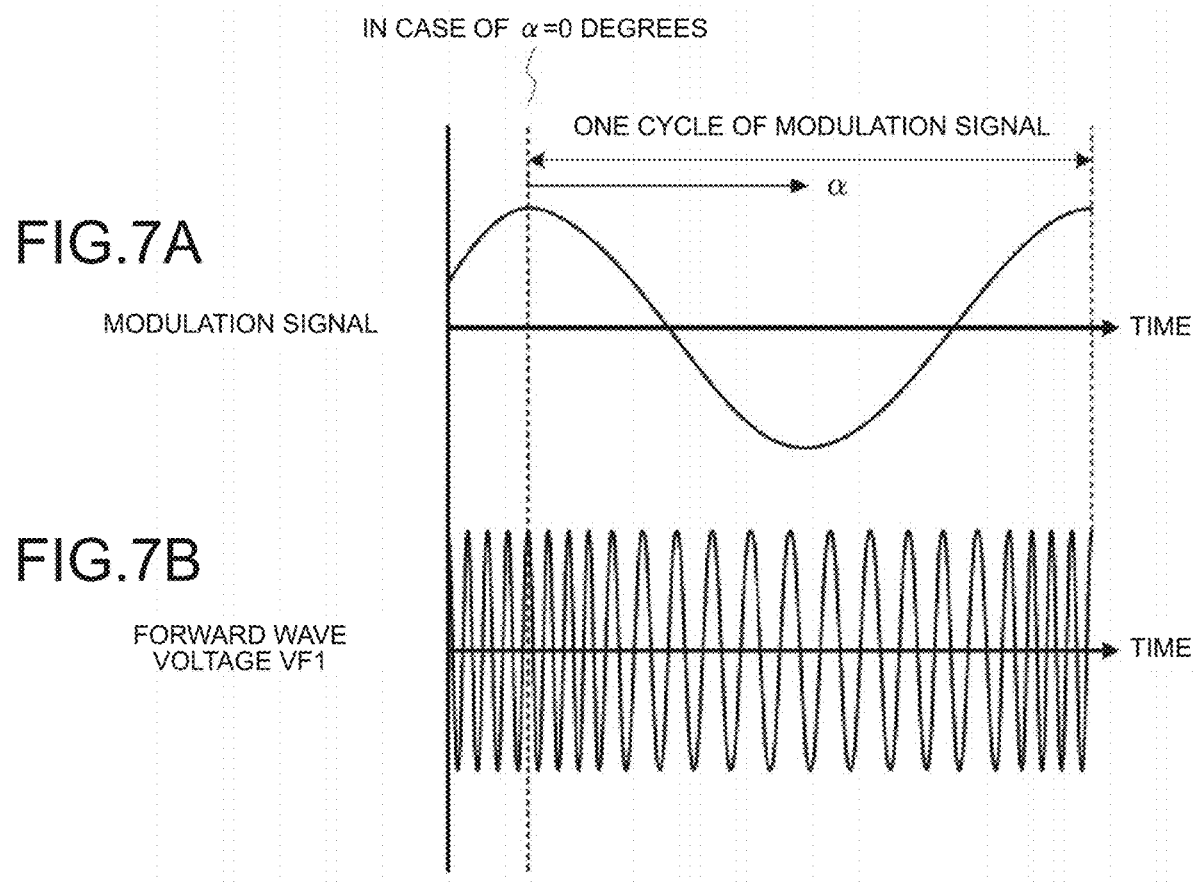
FIGS. 7A and 7B are diagrams illustrating a relationship between the modulation signal and the forward wave voltage VF1.
Figure 10:
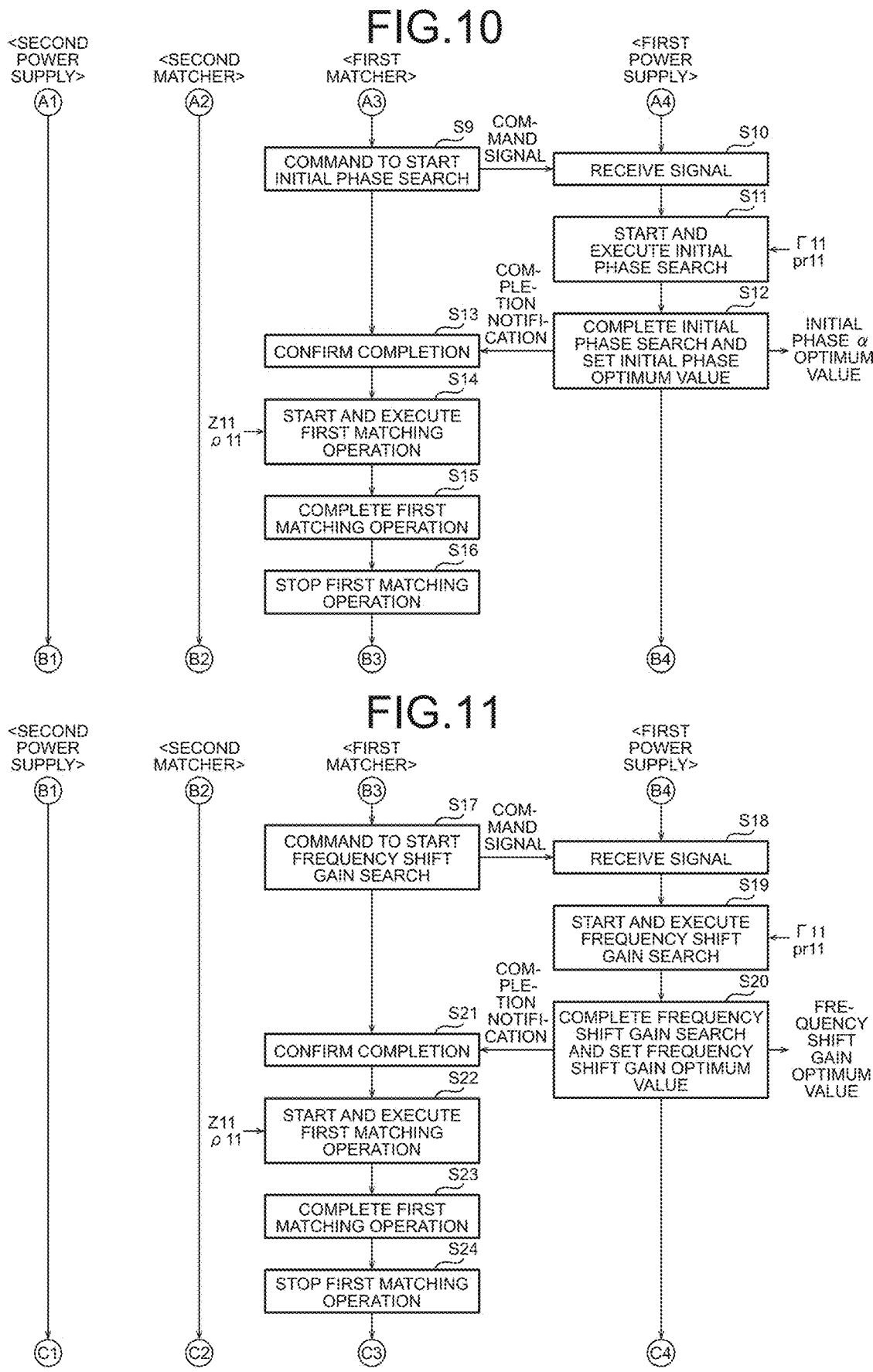
FIG. 10 is an example (part 2) of a flowchart when the frequency modulation control and the frequency offset control are performed.

FIGS. 7A and 7B are diagrams illustrating a relationship between the modulation signal and the forward wave voltage VF1.

FIG. 7A illustrates the waveform of the modulation signal in one cycle during the second power supply ON period, and FIG. 7B illustrates the waveform of the forward wave voltage VF1 output from the first power supply 1 in a period corresponding to the modulation signal.

In the example of FIG. 6, the duty ratio of pulse modulation is 50% (the time of the second power supply ON period and the time of the second power supply OFF period are the same), and the time of the second power supply ON period and the time of the second power supply OFF period are both 20 μs. That is, the frequency of pulse modulation is $\frac{1}{40}$ μs=25 kHz. Note that the frequency of the modulation signal with respect to the time axis is the same frequency (400 kHz in the present embodiment) as the fundamental frequency F2.

In addition, the example of FIG. 6 illustrates a case where the fundamental frequency F1 of the first power supply 1 in the second power supply ON period is 40.68 MHz and the frequency shift is ±1.2 MHz. Therefore, in the second power supply ON period, the fundamental frequency F1 fluctuates in a range of ±1.2 MHz around 40.68 MHz. Note that in the example of FIG. 6, the frequency shift is set to ±1.2 MHz, but the frequency shift is not limited thereto, and can be adjusted within the specification range of the first power supply 1.

By adjusting this frequency shift, the reflection coefficient absolute value Γ1 can be reduced. That is, the reflected wave power value pr1 can be reduced. In this way, as the reflection coefficient absolute value Γ1 decreases, the reflected wave power value pr1 also decreases, and thus control may be performed based on either the reflection coefficient absolute value Γ1 or the reflected wave power value pr1.

In addition, in the example of FIG. 6, the frequency shift is not set to ±1.2 MHz in the entire second power supply ON period, but the frequency shift is reduced at the start of the second power supply ON period, the frequency shift is gradually increased with the lapse of time, and the frequency shift is finally set to ±1.2 MHz. Conversely, the frequency shift is gradually reduced at the end of the second power supply ON period. However, the present invention is not limited thereto, and for example, the frequency shift may be set to ±1.2 MHz in the entire second power supply ON period. In this way, the setting of the frequency shift can be set according to the situation.

In addition, the examples of FIGS. 7A and 7B illustrate the waveform of the forward wave voltage VF1 output from the first power supply 1 in the period corresponding to the modulation signal when a phase (hereinafter, referred to as the initial phase α) at the start of one cycle of the modulation signal is 0 degrees. When there is the correspondence relationship as illustrated in FIGS. 7A and 7B, the frequency of the forward wave voltage VF1 at 0 degrees in one cycle of the modulation signal is high, the frequency of the forward wave voltage VF1 at 180 degrees in one cycle of the modulation signal is low, and the frequency of the forward wave voltage VF1 at 360 degrees in one cycle of the modulation signal is high.

However, since the waveform can be shifted in the time axis direction by changing the value of the initial phase α, the correspondence relationship can be changed. For example, when the initial phase α is set to 180 degrees, the correspondence relationship can be changed such that the frequency of the forward wave voltage VF1 at 0 degrees in one cycle of the modulation signal is low, the frequency of the forward wave voltage VF1 at 180 degrees in one cycle of the modulation signal is high, and the frequency of the forward wave voltage VF1 at 360 degrees in one cycle of the modulation signal is low. In practice, the initial phase α is used at the stage of generating the basic modulation signal described in FIG. 5, and the waveform is shifted in the time axis direction.

Then, the reflection coefficient absolute value Γ1 can also be reduced by adjusting the initial phase α.

That is, the reflection coefficient absolute value Γ1 can be reduced by adjusting the initial phase α and the frequency shift in the second power supply ON period. Therefore, a modulation parameter search step of searching for the optimum value of the initial phase α and the optimum value of the frequency shift based on the reflection coefficient absolute value Γ1 or the reflected wave power value pr1 is provided. Then, the frequency modulation control is performed in the second power supply ON period using the optimum value of the initial phase α and the optimum value of the frequency shift obtained in the modulation parameter search step.

For the modulation parameter search step, for example, as disclosed in JP 2022-102688 A, the initial phase α ("modulation start phase θ" in JP 2022-102688 A) at which the reflection coefficient absolute value Γ1 or the reflected wave power value pr1 is minimized when the initial phase α is changed in a range of 0 to 360 degrees may be obtained by searching. That is, the optimum value of the initial phase α may be obtained by searching. Hereinafter, such a step is referred to as an initial phase search step.

In addition, the frequency shift ("modulation amount gain A" in JP 2022-102688 A) at which the reflection coefficient absolute value Γ1 or the reflected wave power value pr1 is minimized when the frequency shift is changed may be obtained by searching. That is, the optimum value of the frequency shift may be obtained by searching. Hereinafter, such a step is referred to as a frequency shift search step or a frequency shift gain search step.

On the other hand, in the second power supply OFF period, the fundamental frequency of the first power supply 1 is constant at 40.18 MHz. This 40.18 MHz is a frequency (an example of the fundamental frequency F3) obtained by adding an offset frequency of −0.5 MHz to 40.68 MHz that is the fundamental frequency F1. As mentioned above, since the IMD does not occur in the second power supply OFF period, the frequency offset control is performed to reduce the reflection coefficient absolute value Γ1 or the reflected wave power value pr1 instead of performing the frequency modulation control as in the second power supply ON period. In the example of FIG. 6, an offset frequency of −0.5 MHz is set, but since the optimum offset frequency varies depending on the situation, the offset frequency search step of searching for the optimum value of the offset frequency based on the reflection coefficient absolute value Γ1 or the reflected wave power value pr1 is provided. Then, the frequency offset control is performed using the optimum value of the offset frequency obtained in the offset frequency search step.

Note that when the reflected wave power value pr1 is used in the modulation parameter search step and the offset frequency search step, the reflection coefficient absolute value calculation unit 17 is unnecessary, and the reflected wave power value pr1 output from the power information calculation unit 16 is input to the modulation signal generation unit 10.

Next, a configuration and the like of the modulation signal generation unit 10 will be described with reference to FIG. 8.

FIG. 8 is a diagram illustrating a configuration example of the modulation signal generation unit 10.

As illustrated in FIG. 8, the modulation signal generation unit 10 includes a basic modulation signal generation unit 102, a frequency information output unit 103, an initial phase output unit 104, a frequency shift gain output unit 105, a multiplication unit 106, an offset frequency output unit 110, and a second power supply OFF period waveform adjustment unit 120. A clock signal is also input to the modulation signal generation unit 10, and processing is executed for each control cycle based on the clock signal.

The basic modulation signal generation unit 102 is an electronic circuit that generates a basic modulation signal that is a fundamental wave of the modulation signal. For example, a direct digital synthesizer (DDS) can be used for the basic modulation signal generation unit 102, and the clock signal, the phase reset signal, frequency information, and the initial phase $\alpha$ are input to the basic modulation signal generation unit 102. As a result, the basic modulation signal generation unit 102 outputs a desired sinusoidal signal as the basic modulation signal for each control cycle.

The frequency information is information indicating the frequency of the basic modulation signal. The frequency of the basic modulation signal is the same frequency as the fundamental frequency F2 of the forward wave voltage VF2. In the case of the present embodiment, the frequency of the basic modulation signal is 400 kHz. In addition, the phase reset signal is output from the second matcher 4.

The basic modulation signal generation unit 102 resets, at the timing of receiving the phase reset signal, the initial phase of the basic modulation signal to the initial phase $\alpha$ output from the initial phase output unit 104, and outputs a sinusoidal signal at a frequency (400 kHz) indicated by the frequency information as the basic modulation signal (see FIG. 5).

Note that the phase interval of the basic modulation signal output from the basic modulation signal generation unit 102 varies depending on the control cycle of the first power supply 1. For example, when the first power supply 1 operates at a control cycle of 100 MHz, the phase interval is divided into 250 (100 MHz/400 kHz), so that frequency information for each phase interval of 1.44 degrees (360 degrees/250) is output for each control cycle. When the first power supply 1 operates at a control cycle of 500 MHz, the phase interval is divided into 1250 (500 MHz/400 kHz), so that frequency information for each phase interval of 0.288 degrees (360 degrees/1250) is output for each control cycle. The control cycle is set based on a clock signal output from a system clock (not illustrated).

Purpose of Phase Reset Signal

Since the first power supply 1 and the second power supply 2 are different devices, the control cycle is determined based on different clock signals. In another clock signal, the cycle time of the clock signal is slightly different, and thus, there is a difference between a time recognized by the first power supply 1 and a time recognized by the second power supply 2. Therefore, every time processing is executed, the difference between the time recognized by the first power supply 1 and the time recognized by the second power supply 2 accumulates and increases. This difference is preferably eliminated before it becomes too large.

Specifically, due to the difference between the clock signals, there is a difference between an elapsed time from the start timing of the second power supply ON period recognized by the first power supply 1 and an elapsed time from the start timing of the second power supply ON period recognized by the second power supply 2. In this case, accurate control cannot be performed.

Therefore, the above difference is eliminated by inputting the phase reset signal to the basic modulation signal generation unit 102 of the first power supply 1 at a predetermined timing.

As mentioned above, since the phase reset signal is generated based on the detection signal of the forward wave voltage VF2 detected by the second matcher 4, the accumulation of the difference described above does not occur. Therefore, when the phase reset signal generated based on the detection signal of the forward wave voltage VF2 detected by the second matcher 4 is used, accurate control can be performed, and an effect of reducing the reflected wave power when the frequency modulation control is performed can be enhanced.

It is preferable that the basic modulation signal generation unit 102 receives the phase reset signal at least at the start timing of the second power supply ON period to eliminate the difference.

The initial phase $\alpha$ at which modulation of the basic modulation signal is to be started is set in the initial phase output unit 104, and the initial phase output unit 104 outputs the initial phase $\alpha$ to the basic modulation signal generation unit 102. Note that the initial phase $\alpha$ is a phase difference from a reference phase (for example, 0 degrees).

In addition, the initial phase output unit 104 executes the initial phase search step when the initial phase search command is input. The optimum value of the initial phase $\alpha$ obtained by searching in the initial phase search step is set as a new initial phase $\alpha$.

The initial phase output unit 104 receives information on the reflection coefficient absolute value $\Gamma1$ or information on the reflected wave power value pr1 in order to execute the initial phase search step. Then, the initial phase $\alpha$ is sequentially changed, and the initial phase $\alpha$ at which the reflection coefficient absolute value $\Gamma1$ or the reflected wave power value pr1 is minimized is selected.

In the frequency shift gain output unit 105, a frequency shift gain for increasing or reducing the frequency shift of the basic modulation signal is set, and the set frequency shift gain is output to the multiplication unit 106.

The frequency shift is a frequency change width in the frequency modulation of the fundamental frequency F1 of the first power supply 1, and a setting range is determined based on the specification of the first power supply 1.

For example, when the specification of the frequency shift of the first power supply 1 is ±1.2 MHz at the maximum with respect to the fundamental frequency F1, the frequency shift gain is set such that a processing result in the multiplication unit 106 described later falls within the above range. In the present embodiment, since the frequency shift of the basic modulation signal is set to ±1 MHz as illustrated in FIG. 5, the frequency shift gain is set at a magnification with respect to ±1 MHz. For example, when the frequency modulation range of the fundamental frequency F1 of the first power supply 1 is set to ±1.2 MHz, the frequency shift gain may be set to 1.2.

In addition, the frequency shift gain output unit 105 executes the frequency shift gain search step when a frequency shift gain search command is input. The optimum value of the frequency shift gain obtained by searching in the frequency shift gain search step is set as a new frequency shift gain.

The frequency shift gain output unit 105 receives the reflection coefficient absolute value Γ1 or the reflected wave power value pr1 in order to execute the frequency shift gain search step. Then, the initial phase α is sequentially changed, and the frequency shift gain at which the reflection coefficient absolute value Γ1 or the reflected wave power value pr1 is minimized is selected.

The multiplication unit 106 multiplies the frequency information indicated by the basic modulation signal by the frequency shift gain for each control cycle, and outputs the multiplication result to the second power supply OFF period waveform adjustment unit 120 as an adjustment modulation signal. The frequency shift of the fundamental frequency F1 of the first power supply 1 is determined by the processing in the multiplication unit 106.

In the offset frequency output unit 110, offset frequency information for offsetting frequency information in the second power supply OFF period is set. This offset frequency information is output to the second power supply OFF period waveform adjustment unit 120. In the present embodiment, as illustrated in FIG. 6, the offset frequency is set to −0.5 MHz.

In addition, the offset frequency output unit 110 executes the offset frequency search step when an offset frequency search command is input. The optimum value of the offset frequency obtained by searching in the offset frequency search step is set as a new offset frequency.

The offset frequency output unit 110 receives the reflection coefficient absolute value Γ1 or the reflected wave power value pr1 in order to execute the offset frequency search step. Then, the offset frequency is sequentially changed, and the offset frequency at which the reflection coefficient absolute value Γ1 or reflected wave power value pr1 is minimized is selected.

The second power supply OFF period waveform adjustment unit 120 receives the frequency information indicated by the adjustment modulation signal, the synchronization pulse signal, and the offset frequency information output from the offset frequency output unit 110 for each control cycle. The adjustment modulation signal is a signal obtained by applying the initial phase α and the frequency shift to the basic modulation signal illustrated in FIG. 5, but there is no distinction between the second power supply ON period and the second power supply OFF period, and no offset frequency is applied. Therefore, using the synchronization pulse signal and the offset frequency information, the second power supply ON period and the second power supply OFF period are distinguished from each other, and the offset frequency is applied. As a result, the modulation signal illustrated in FIG. 6 can be generated.

Flowchart

The frequency modulation control and the frequency offset control of the first power supply 1 will be further described below with reference to a flowchart.

FIGS. 9 to 12 are examples of flowcharts when the frequency modulation control and the frequency offset control are performed. Note that FIGS. 9 to 12 illustrate a series of steps divided into four. In addition, the steps are illustrated from the top to the bottom in the order of the second power supply 2, the second matcher 4, the first matcher 3, and the first power supply 1 from the left side in each drawing. In addition, it is assumed that the second power supply ON period and the second power supply OFF period are substantially the same time.

In Step S1, the first power supply 1, the second power supply 2, the first matcher 3, and the second matcher 4 stand by at initial values.

In Step S2, the supply of the forward wave power PF1 from the first power supply 1 to the load is started, and the supply of the forward wave power PF2 from the second power supply 2 to the load is started. This power supply is continued thereafter. As a result, the first matching operation is started in the first matcher 3, and the second matching operation is started in the second matcher 4. At this time, the first matcher 3 performs the first matching operation based on the load-side impedance Z13 or the reflection coefficient ρ13 in both the second power supply ON period and the second power supply OFF period. That is, a matching operation using a weighted average is performed.

The first matcher 3 and the second matcher 4 each perform the matching operation and attempt to reduce reflected wave power by the maximum amount. As a result, as illustrated in Step S3, each matching operation is completed.

FIG. 13A is a Smith chart illustrating an example of a locus 80 of the load-side impedance Z1 or the reflection coefficient ρ1 and a center 81 of the locus 80 at the time point of completion of Step S3. As illustrated in this example, the load-side impedance Z1 or the reflection coefficient ρ1 fluctuates in a certain range. Therefore, the center 81 of the locus 80 of the load-side impedance Z1 is considered as a representative value, and control is performed such that the center 81 approaches the center of the Smith chart.

In addition, as illustrated in FIG. 13A, the fluctuation range of the load-side impedance Z13 or the reflection coefficient ρ13 is wide at this stage, and the center 81 of the locus 80 is away from the center of the Smith chart.

Since the second power supply 2 is configured to perform pulse modulation of repeating the ON operation of outputting the forward wave voltage VF2 and the OFF operation of not outputting the forward wave voltage VF2 in a predetermined cycle, the IMD occurs in the second power supply ON period, and the reflected wave power PR1 on the first power supply 1 side increases.

Therefore, as illustrated in Step S4, the first matcher 3 detects an IMD state. As a result, as illustrated in Step S5, the first matcher 3 starts the first matching operation. At this time, the first matcher 3 performs the first matching operation based on the load-side impedance Z11 or the reflection coefficient ρ11 in the second power supply ON period.

The first matcher 3 reduces the reflected wave power by the maximum amount. As a result, as illustrated in Step S6, the matching operation is completed. At this time, as illustrated in FIG. 13B, the fluctuation range of the load-side impedance Z11 or the reflection coefficient ρ11 is wide, but the center 81 of the locus 80 moves to the vicinity of the center of the Smith chart.

However, at this time point, the frequency modulation control is not performed, and the initial phase α, the frequency shift (set by the frequency shift gain), and the offset frequency are not appropriate. Therefore, the modulation parameter search step and the offset frequency search step are executed in order to obtain the optimum values of these parameters. Note that the modulation parameter search step includes the initial phase search step and the frequency shift gain search step.

As illustrated in Step S7, the first matching operation in the first matcher 3 is stopped. As a result, the first matcher 3 maintains the variable value of the variable element without changing the variable value. In addition, as illustrated in Step S8, the start of frequency modulation is determined.

Thereafter, as illustrated in Step S9, the first matcher 3 commands the first power supply 1 to start the initial phase search step.

After receiving this command as illustrated in Step S10, the first power supply 1 performs an operation of searching for the optimum value of the initial phase α as illustrated in Step S11. At this time, the first power supply 1 executes the initial phase search step based on the reflection coefficient absolute value Γ11 or the reflected wave power value pr11 in the second power supply ON period.

As illustrated in Step S12, when the search for the optimum value of the initial phase α is completed, the first power supply 1 sets the optimum value of the initial phase α as a new initial phase α. Along with this, the first power supply 1 notifies the first matcher 3 that the initial phase search step has been completed.

Figure 14A:
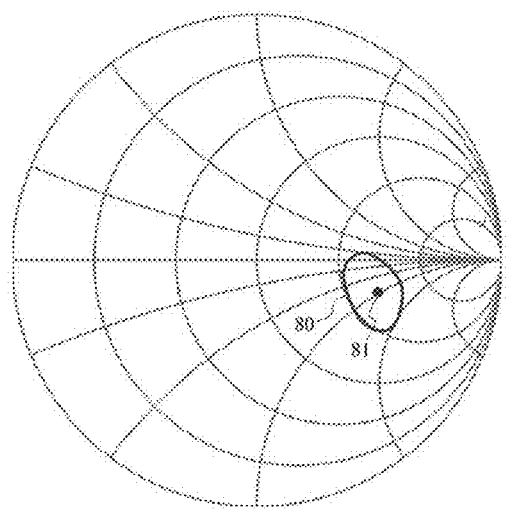
FIGS. 14A and 14B are examples (part 2) of the load-side impedance Z1 or the reflection coefficient ρ1.

At this time, as illustrated in FIG. 14A, the center 81 of the locus 80 of the load-side impedance Z11 or the reflection coefficient ρ11 is away from the center of the Smith chart.

When the first matcher 3 receives the completion notification as illustrated in Step S13, the first matcher 3 starts the first matching operation as illustrated in Step S14. At this time, the first matcher 3 performs the first matching operation based on the load-side impedance Z11 or the reflection coefficient ρ11 in the second power supply ON period.

Figure 14B:
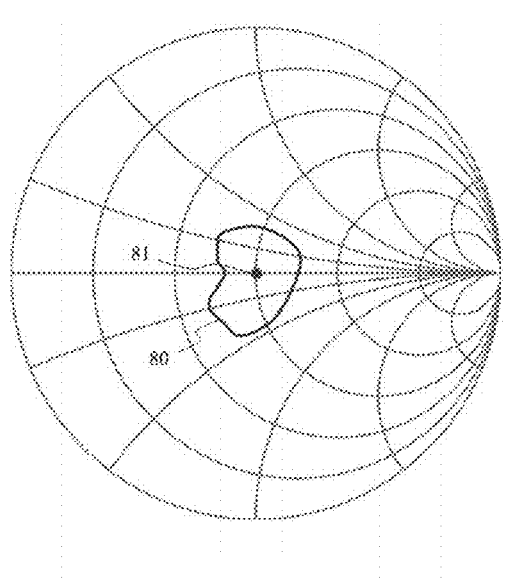

The first matcher 3 reduces the reflected wave power by the maximum amount. As a result, as illustrated in Step S15, the matching operation is completed. At this time, as illustrated in FIG. 14B, the center 81 of the locus 80 of the load-side impedance Z11 or the reflection coefficient ρ11 moves to the vicinity of the center of the Smith chart.

Next, as illustrated in Step S16, the first matching operation in the first matcher 3 is stopped. As a result, the first matcher 3 maintains the variable value of the variable element without changing the variable value. Thereafter, as illustrated in Step S17, the first matcher 3 commands the first power supply 1 to start the frequency shift gain search step.

After receiving this command as illustrated in Step S18, the first power supply 1 performs an operation of searching for the optimum value of the frequency shift gain as illustrated in Step S19. At this time, the first power supply 1 executes the frequency shift gain search step based on the reflection coefficient absolute value Γ11 or the reflected wave power value pr11 in the second power supply ON period.

Figure 15A:
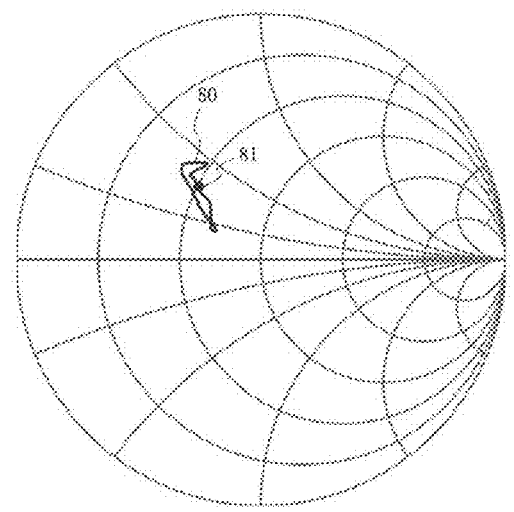
FIGS. 15A and 15B are examples (part 3) of the load-side impedance Z1 or the reflection coefficient ρ1.

As illustrated in Step S20, when the search for the optimum value of the frequency shift gain is completed, the first power supply 1 sets the optimum value of the frequency shift gain as a new frequency shift gain. Along with this, the first power supply 1 notifies the first matcher 3 that the frequency shift gain search step has been completed. At this time, as illustrated in FIG. 15A, the center 81 of the locus 80 of the load-side impedance Z11 or the reflection coefficient ρ11 is away from the center of the Smith chart, but the fluctuation range of the load-side impedance Z11 or the reflection coefficient ρ11 is narrowed.

Figure 15B:
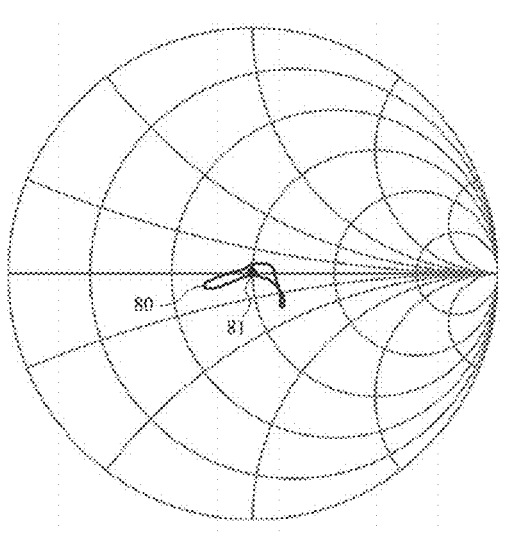

When the first matcher 3 receives the completion notification as illustrated in Step S21, the first matcher 3 starts the first matching operation as illustrated in Step S22. At this time, the first matcher 3 performs the first matching operation based on the load-side impedance Z11 or the reflection coefficient ρ11 in the second power supply ON period. The first matcher 3 reduces the reflected wave power by the maximum amount. As a result, as illustrated in Step S23, the matching operation is completed. At this time, as illustrated in FIG. 15B, the center 81 of the locus 80 of the load-side impedance Z11 or the reflection coefficient ρ11 moves to the vicinity of the center of the Smith chart.

Next, as illustrated in Step S24, the first matching operation in the first matcher 3 is stopped. As a result, the first matcher 3 maintains the variable value of the variable element without changing the variable value. Thereafter, as illustrated in Step S25, the first matcher 3 commands the first power supply 1 to start the offset frequency search step.

After receiving this command as illustrated in Step S26, the first power supply 1 performs an operation of searching for the optimum value of the offset frequency as illustrated in Step S27. At this time, the first power supply 1 executes the offset frequency search step based on the reflection coefficient absolute value Γ12 or the reflected wave power value pr12 in the second power supply OFF period.

As illustrated in Step S28, when the search for the optimum value of the offset frequency is completed, the first power supply 1 sets the optimum value of the offset frequency as a new offset frequency. Along with this, the first power supply 1 notifies the first matcher 3 that the offset frequency search step has been completed. Note that the first power supply 1 continues the supply of the forward wave power PF1 to the load.

When the first matcher 3 receives the completion notification as illustrated in Step S29, the first matcher 3 starts the first matching operation as illustrated in Step S30. At this time, the first matcher 3 performs the first matching operation based on the load-side impedance Z13 or the reflection coefficient ρ13 in both the second power supply ON period and the second power supply OFF period. That is, a matching operation using a weighted average is performed.

The first matcher 3 reduces the reflected wave power by the maximum amount. As a result, as illustrated in Step S31, the matching operation is completed. Note that the first matcher 3 continues the first matching operation, and performs an operation of reducing the reflected wave power when a reflection coefficient absolute value that can be calculated from the load-side impedance Z13 or the reflection coefficient ρ13 is larger than the predetermined threshold value.

Note that in the second power supply OFF period, the first matcher 3 preferably maintains the variable value of the variable element adjusted by the first matching operation in the second power supply ON period without changing the variable value. In this way, the frequency offset control can be stably performed.

Here, the offset frequency search step described above will be further described.

Figure 16:
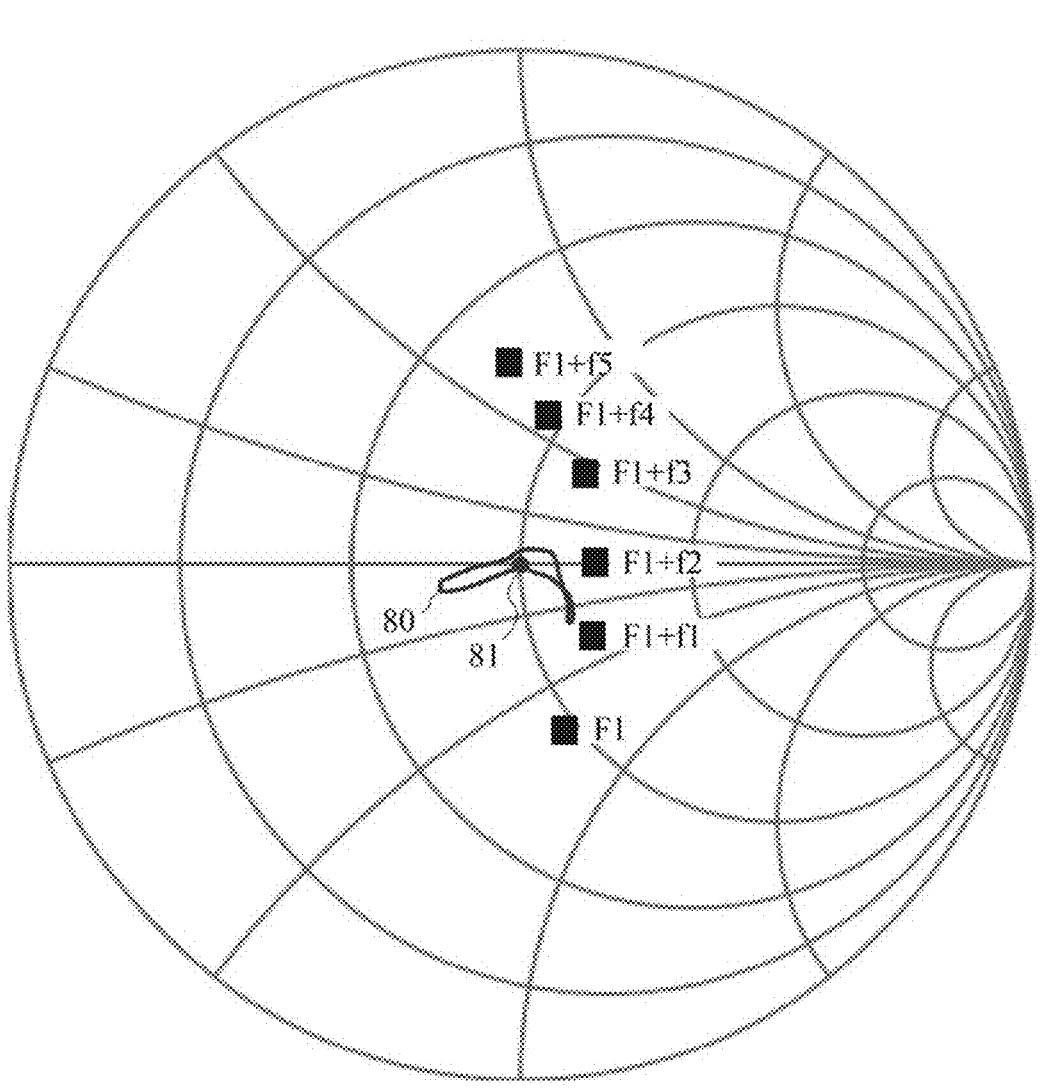
FIG. 16 is a diagram for explaining an offset frequency search step.

FIG. 16 is a diagram for explaining the offset frequency search step.

When the forward wave voltage VF1 is output from the first power supply 1 in the second power supply OFF period at the time point when the offset frequency search step is started, the load-side impedance Z12 or the reflection coefficient ρ12 is, for example, as illustrated in "F1" in FIG. 16. However, since the magnitude of the reflection coefficient ρ12 is large in this case, the offset frequency search step is executed to search for the offset frequency at which the load-side impedance Z12 or the reflection coefficient ρ12 is closest to the center of the Smith chart.

In FIG. 16, f1, f2, f3, f4, and f5 are examples of candidates for the offset frequency. In addition, F1, F1+f1, F1+f2, F1+f3, F1+f4, and F1+f5 represent the fundamental frequency F3 obtained by adding the offset frequency candidate to the fundamental frequency F1. Note that F1 in FIG. 16 is the fundamental frequency F3 in a case where there is no offset frequency (in the case of 0 MHz).

Under such conditions, F1, F1+f1, F1+f2, F1+f3, F1+f4, and F1+f5 are sequentially set as the fundamental frequency F3 in the second power supply OFF period. Then, when the forward wave voltage VF3 having the fundamental frequency F3 is output from the first power supply 1, the load-side impedance Z12 or the reflection coefficient ρ12 in the second power supply OFF period changes as illustrated in FIG. 16 with the change in the fundamental frequency F3.

In the example illustrated in FIG. 16, when the fundamental frequency F3 is F1+f2, that is, when the offset frequency is f2, the load-side impedance Z12 or the reflection coefficient ρ12 is closest to the center of the Smith chart. Therefore, f2 may be adopted as the offset frequency.

Here, the objective of the offset frequency search step will be described.

The purpose of the offset frequency search step is to search for an offset frequency for reducing the reflected wave power in the second power supply OFF period, but it is necessary to consider not only the second power supply OFF period but also the relationship with the second power supply ON period.

Specifically, after the frequency modulation parameter search step and the offset frequency search step are completed, processing using the initial phase α, the frequency shift (frequency shift gain), and the offset frequency determined in these steps is performed. At this time, as illustrated in Step S30, the first matcher 3 performs a matching operation using a weighted average. Therefore, it is desirable that a difference between the load-side impedance Z11 or the reflection coefficient ρ11 in the second power supply ON period and the load-side impedance Z12 or the reflection coefficient ρ12 in the second power supply OFF period be small.

In the case of the present embodiment, it is desirable that a difference between the load-side impedance Z11 or the reflection coefficient ρ11 corresponding to the center 81 of the locus 80 illustrated in FIG. 16 and the load-side impedance Z12 or the reflection coefficient ρ12 when the fundamental frequency F3 is F1+f2 be small.

In view of this context, it is originally necessary to calculate the load-side impedance Z1 or the reflection coefficient ρ1 in the first power supply 1. That is, the first power supply sensor 15 may need to have a configuration similar to that of the first-side sensor 32 of the first matcher 3, and the power information calculation unit 16 needs to have a calculation function similar to that of the first-side calculation unit 34 of the first matcher 3. In such a case, the configuration of the first power supply 1 needs to be changed, and in addition, the calculation load increases.

On the other hand, in the present embodiment, the reflection coefficient absolute value Γ1 or the reflected wave power value pr1 may be calculated. Specifically, the reflection coefficient absolute value Γ11 or the reflected wave power value pr11 may be calculated in the second power supply OFF period, and the reflection coefficient absolute value Γ12 or the reflected wave power value pr12 may be calculated in the second power supply OFF period.

This is because, as illustrated in FIGS. 14A and 14B, the center 81 of the locus 80 of the load-side impedance Z11 or the reflection coefficient ρ11 in the second power supply ON period at the time point of completion of Step S23 is located in the vicinity of the center of the Smith chart.

Therefore, even if it is assumed that the load-side impedance Z11 or the reflection coefficient ρ11 in the second power supply ON period is at the center of the Smith chart, the error is small. Therefore, even if the reflection coefficient absolute value Γ12 or the reflected wave power value pr12 is calculated in the second power supply OFF period, the processing according to the above objective can be performed. This is because the reflection coefficient absolute value Γ12 corresponds to the difference between the load-side impedance Z11 or the reflection coefficient ρ11 in the second power supply ON period and the load-side impedance Z12 or the reflection coefficient ρ12 in the second power supply OFF period. Then, the smaller the reflection coefficient absolute value Γ12 is, the smaller the above difference is, so that the offset frequency at which the reflection coefficient absolute value Γ12 is minimized may be obtained by searching.

A similar idea can be applied to the reflected wave power value pr12, and the smaller the reflected wave power value pr12 is, the smaller the above difference is, so that the offset frequency at which the reflected wave power value pr12 is minimized may be obtained by searching.

Of course, when the center 81 of the locus 80 of the load-side impedance Z11 or the reflection coefficient ρ11 in the second power supply ON period at the time point of completion of Step S23 deviates from the vicinity of the center of the Smith chart, the accuracy of the frequency offset control is reduced according to the deviation amount. However, since the center 81 of the locus 80 usually falls within an allowable range (for example, Γ<0.03), there is no problem in practical use.

Figure 17:
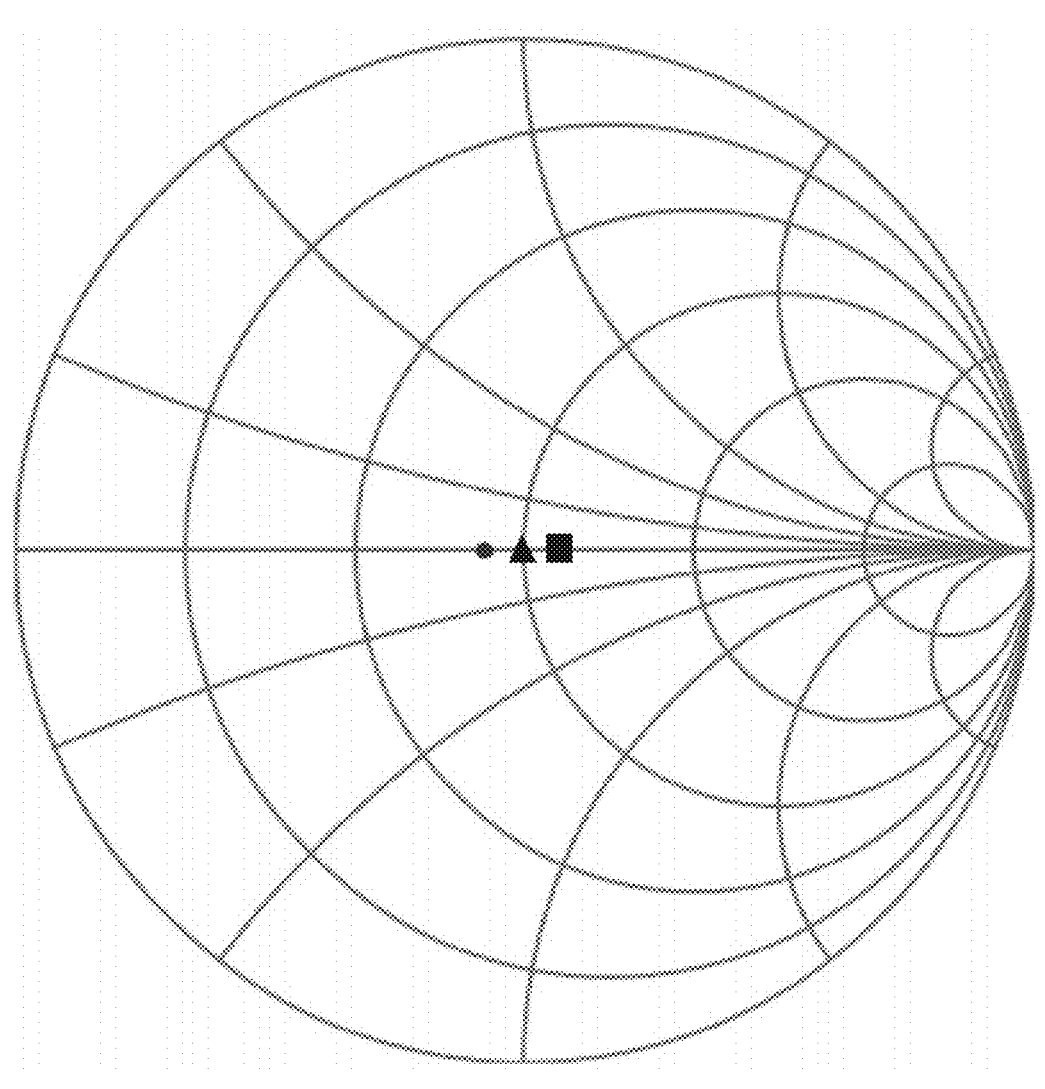
FIG. 17 is an example of a load-side impedance or a reflection coefficient when a first matching operation is executed after the offset frequency search step is completed.

FIG. 17 is an example of the load-side impedance when the first matching operation is executed after the offset frequency search step is completed.

In FIG. 17, "●" is the center of the locus 80 of the load-side impedance Z11 or the reflection coefficient ρ11, "■" is the load-side impedance Z12 or the reflection coefficient ρ12, and "▲" is the load-side impedance Z13 or the reflection coefficient ρ13.

Note that at this time point, since the optimum values of the initial phase α, the frequency shift gain, and the offset frequency are applied, the frequency modulation control is accurately performed in the second power supply ON period, and the frequency offset control is accurately performed in the second power supply OFF period.

In addition, at this stage, a matching operation by a weighted average is performed. In the present embodiment, since the second power supply ON period and the second power supply OFF period are substantially the same time, control is performed such that "▲" indicating the load-side impedance Z13 illustrated in FIG. 17 reaches the center position of the Smith chart.

As described above, the optimum values of the initial phase α and the frequency shift gain necessary for the frequency modulation control and the optimum value of the offset frequency necessary for the offset frequency control may be acquired, and by applying these parameters, the reflected wave power can be reduced by the maximum amount.

In addition, according to the high-frequency power supply system 90 of the present embodiment, it is possible to reduce the difference between the time recognized by the first power supply and the time recognized by the second power supply even when the second power supply 2 performs the pulse modulation of repeating the ON operation of outputting the forward wave voltage VF2 and the OFF operation of not outputting the forward wave voltage VF2 while the first power supply outputs the forward wave voltage VF1.

According to the high-frequency power supply system of the present invention, it is possible to reduce the difference between the time recognized by the first power supply and the time recognized by the second power supply even when the second power supply performs the pulse modulation of repeating the ON operation of outputting the forward wave voltage VF2 and the OFF operation of not outputting the forward wave voltage VF2 while the first power supply outputs the forward wave voltage VF1.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high-frequency power supply system comprising:
a second power supply configured to output a second forward wave voltage having a second fundamental frequency lower than a first fundamental frequency, the second power supply performing pulse modulation of repeating an ON operation of outputting the second forward wave voltage and an OFF operation of not outputting the second forward wave voltage;

a first power supply configured to output a first forward wave voltage having the first fundamental frequency, the first power supply performing frequency modulation control of frequency-modulating the first forward wave voltage with a modulation signal having a frequency substantially identical with the second fundamental frequency in a second power supply ON period in which the ON operation is performed;
a first matcher connected between the first power supply and a load; and
a second matcher connected between the second power supply and the load, wherein
the second matcher generates a phase reset signal having a frequency lower than the second fundamental frequency, based on detection information of the second forward wave voltage, and supplies the phase reset signal to the first power supply, and
the first power supply sets an initial phase of the modulation signal at a timing of receiving the phase reset signal when performing the frequency modulation control of frequency-modulating the first forward wave voltage with the modulation signal having a frequency substantially identical with the second fundamental frequency.

2. The high-frequency power supply system according to claim 1, wherein the second matcher extracts a pulse signal having a cycle substantially identical with the second fundamental frequency from the detection information of the second forward wave voltage, and generates the phase reset signal by dividing the pulse signal.

* * * * *